(12) United States Patent
Takemoto et al.

(10) Patent No.: US 7,205,090 B2
(45) Date of Patent: Apr. 17, 2007

(54) CHEMICAL AMPLIFICATION TYPE POSITIVE RESIST COMPOSITION

(75) Inventors: Ichiki Takemoto, Kawanishi (JP); Kazuhiko Hashimoto, Toyonaka (JP); Satoshi Yamaguchi, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/037,286

(22) Filed: Jan. 19, 2005

(65) Prior Publication Data

US 2005/0158656 A1   Jul. 21, 2005

(30) Foreign Application Priority Data

Jan. 21, 2004  (JP) ............................ 2004-012917

(51) Int. Cl.
  *G03F 7/004*  (2006.01)
(52) U.S. Cl. .................... 430/270.1; 430/914; 430/921
(58) Field of Classification Search ..................... None
See application file for complete search history.

(56) References Cited

U.S. PATENT DOCUMENTS

| 6,239,231 B1 | 5/2001 | Fujishima et al. |
| 6,579,659 B2 | 6/2003 | Uetani et al. |
| 2004/0191676 A1* | 9/2004 | Nakao et al. ............ 430/270.1 |

FOREIGN PATENT DOCUMENTS

| EP | 0856773 A1 | 8/1998 |
| JP | 8-101509 A | 4/1996 |
| JP | 2003-202673 A | 7/2003 |
| JP | 2003-280201 A | 10/2003 |

\* cited by examiner

*Primary Examiner*—Rosemary Ashton
(74) *Attorney, Agent, or Firm*—Birch, Stewart, Kolasch & Birch, LLP

(57) ABSTRACT

The present invention provides a chemical amplification type positive resist composition comprising
(A) a resin which comprises (i) 5 to 50% by mol of a structural unit of the formula (I), (ii) 5 to 50% by mol of a structural unit of the formula (II) and (iii) 5 to 50% by mol of at least one selected from the group consisting of structural units of the formulas (III) and (IV), and
(B) an acid generator. The present composition is suitable for excimer laser lithography using ArF, KrF and the like, and shows various outstanding resist abilities, specifically, gives better effective sensitivity and resolution to resist patterns obtained therefrom, and gives particularly excellent pattern shape and excellent line edge roughness.

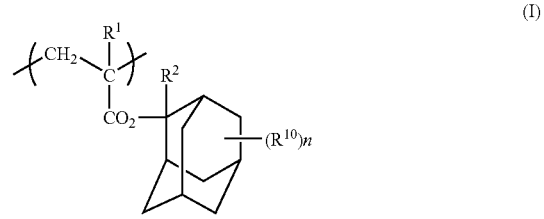

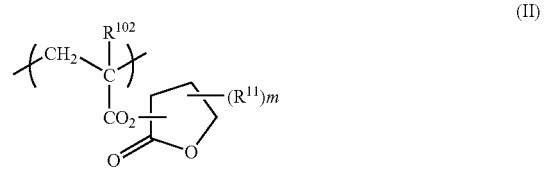

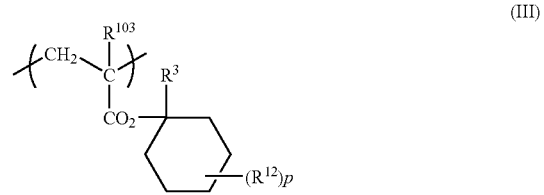

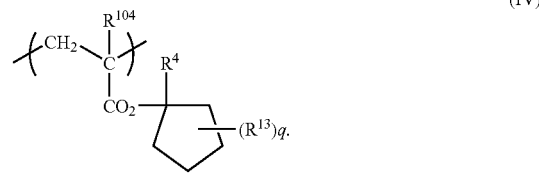

12 Claims, No Drawings

CHEMICAL AMPLIFICATION TYPE POSITIVE RESIST COMPOSITION

This nonprovisional application claims priority under 35 U.S.C. § 119(a) on Patent Application No. 2004-012917 filed in JAPAN on Jan. 21, 2004, the entire contents of which are hereby incorporated by reference.

BACKGROUND OF THE INVENTION

1. Field of the Invention

The present invention relates to a chemical amplification type positive resist composition used in fine processing of semiconductors.

2. Related Art

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g line having a wavelength of 436 nm, i line having a wavelength of 365 nm, KrF excimer laser having a wavelength of 248 nm and ArF excimer laser having a wavelength of 193 nm. $F_2$ excimer laser having a wavelength of 157 nm seems to be the next-generation exposure light source. Further, as the exposure light source of the subsequent generation, soft X ray (EUV) having a wavelength of 13 nm or shorter has been proposed as the exposure light source following the 157 nm-wavelength $F_2$ excimer laser.

As line width has become narrower in lithography process using light sources having shorter wavelength, such as excimer laser and the like, especially line edge roughness (chaps of pattern surfaces, abbreviated by LER), as well as resolution, sensitivity and collapse of patterns, has become considerable problems (e.g. Proc. of SPIE Vol. 5038 (2003), 689–698). Some photoresist compositions using 2-alkyl-2-cyclohexyl(meth)acrylate or 2-alkyl-2-cyclopentyl(meth)acrylate have been proposed (e.g. JP-A-H08-101509, JP-A-2003-202673 and JP-A-2003-280201). However, such photoresist compositions don't have enough sensitivity and resolution and don't have improved line edge roughness.

With further advance of microfabrication technology, it is required for new photoresist compositions to show more advantageous abilities than conventional photoresists. Specifically, such photoresist compositions giving better resolution, sensitivity, pattern profiles to resist pattern obtained therefrom, especially giving better line edge roughness are required.

SUMMARY OF THE INVENTION

An object of the present invention is to provide a chemical amplification type resist composition suitable for excimer laser lithography using ArF, KrF and the like, showing excellent various resist abilities, and giving particularly excellent line edge roughness.

The present invention relates to the followings:

<1> A Chemical Amplification Type Positive Resist Composition Comprising (A) a resin which comprises (i) 5 to 50% by mol, based on total structural units in the resin, of a structural unit of the formula (I)

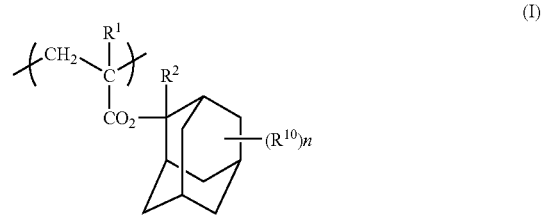

(I)

wherein $R^1$ represents a hydrogen or a methyl, $R^2$ represents an alkyl, $R^{10}$ represents a halogen, a hydroxyl, an alkyl or an alkoxy, n represents an integer of 0 to 3, and when n is 2 or 3, each of $R^{10}$ is the same or different, (ii) 5 to 50% by mol, based on total of structural units in the resin, of a structural unit of the formula (II)

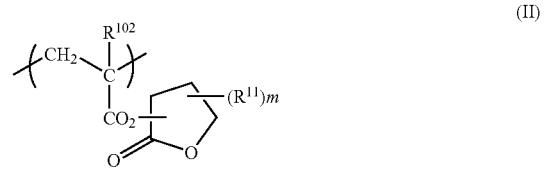

(II)

wherein $R^{102}$ represents a hydrogen or a methyl, $R^{11}$ represents an alkyl or an alkoxy, m represents an integer of 0 to 3, and when m is 2 or 3, each of $R^{11}$ is the same or different, and (iii) 5 to 50% by mol, based on total of structural units in the resin, of at least one selected from the group consisting of structural units of the formulas (III) and (IV)

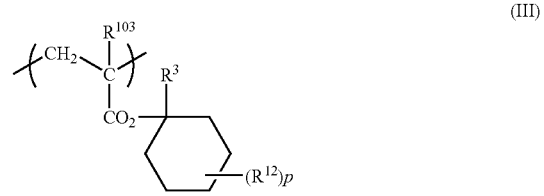

(III)

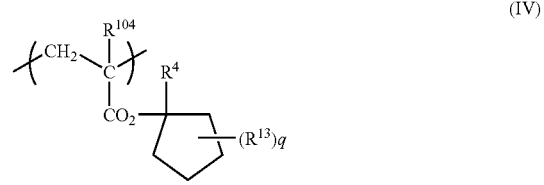

(IV)

wherein $R^{103}$ and $R^{104}$ each independently represents a hydrogen or a methyl, $R^3$ and $R^4$ each independently represents an alkyl, $R^{12}$ and $R^{13}$ each independently represents an alkyl or an alkoxy, p and q each independently represents an integer of 0 to 3, when p is 2 or 3, each of $R^{12}$ is the same or different, and when q is 2 or 3, each of $R^{13}$ is the same or different, and (B) an acid generator.

<2> The Composition According to <1>, Wherein the Structural Unit of the Formula (I) is a Structural Unit of the Formula (Ia)

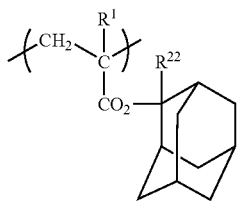
(Ia)

wherein $R^{22}$ represents a methyl, a ethyl or a isopropyl and $R^1$ has the same meaning as defined in <1>, the structural unit of the formula (II) is a structural unit of the formula (IIa)

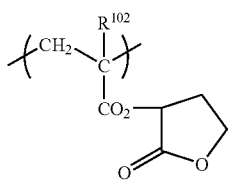
(IIa)

wherein $R^{102}$ has the same meaning as defined in <1>, and at least one structural unit of the formulas (III) and (IV) is at least one selected from the group consisting of structural units of the formulas (IIIa) and (IVa)

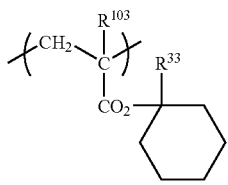
(IIIa)

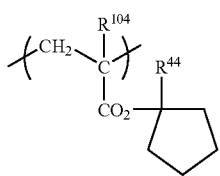
(IVa)

wherein $R^{33}$ and $R^{44}$ each independently represents a methyl, an ethyl or an isopropyl, and $R^{103}$ and $R^{104}$ have the same meanings as defined in <1>.

<3> The Composition According to <1> or <2> Which Further Comprising 80% by mol or Less of at Least one Selected from the Group Consisting of Structural Units of the Formulas (V) and (VI)

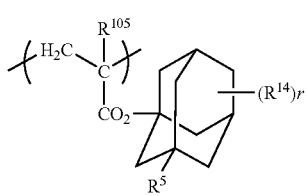
(V)

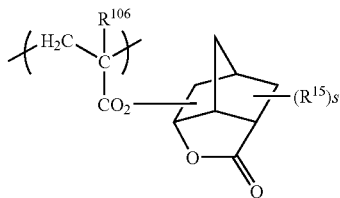
(VI)

wherein $R^{105}$ and $R^{106}$ each independently represents a hydrogen or a methyl, $R^5$ represents a hydroxyl or a hydroxymethyl, $R^{14}$ represents a hydroxyl, an alkyl or an alkoxy, $R^{15}$ represents an alkyl, r and s each independently represents an integer of 0 to 3, when r is 2 or 3, each of $R^{14}$ is the same or different, and when s is 2 or 3, each of $R^{15}$ is the same or different.

<4> The Composition According to <3> Wherein at Least one Selected from the Group Consisting of Structural Units of the Formulas (V) and (VI) is at Least one Selected from the Group Consisting of Structural Units of the Formulas (Va) and (VIa)

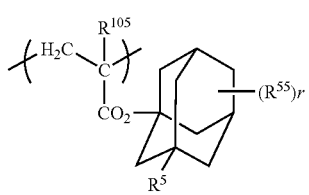
(Va)

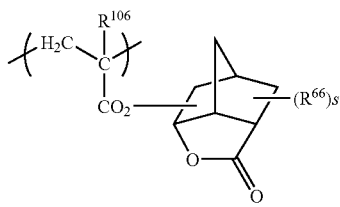
(VIa)

wherein $R^{55}$ represents a hydroxyl, a methyl, an ethyl or a methoxy, $R^{66}$ represents a methyl or an ethyl, r and s each independently represents an integer of 0 to 3, when r is 2 or 3, each of $R^{55}$ is the same or different, and when s is 2 or 3, each of $R^{66}$ is the same or different, $R^{105}$, $R^{106}$ and $R^5$ each independently has the same meaning as defined in <3>.

<5> The Composition According to any one of <1> to <4> Wherein the Acid Generator is at Least one Compound Selected from the Group Consisting of an Onium Salt, an Organic Halogen Compound, a Sulfone Compound and a Sulfonate Compound.

<6> The Composition According to Any One of <1> to <4> Wherein the Acid Generator is Onium Salt.

<7> The Composition According to Any One of <1> to <4> Wherein the Acid Generator is the One Selected from the Group Consisting of a Sulfonium Salt of the Formula (VIIa)

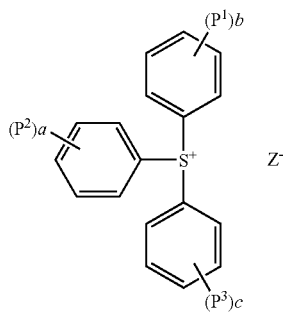

wherein $P^1$ to $P^3$ each independently represents a hydroxyl, an alkyl having 1 to 6 carbon atoms or an alkoxy having 1 to 6 carbon atoms, a, b and c each independently represents an integer of 0 to 3, when a is 2 or more, each of $P^1$ is the same or different, when b is 2 or more, each of $P^2$ is the same or different, when c is 2 or more, each of $P^3$ is the same or different, and $Z^-$ represents an organic counter anion, an iodonium salt of the formula (VIIb)

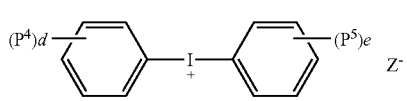

wherein $P^4$ and $P^5$ each independently represents a hydroxyl, an alkyl having 1 to 6 carbon atoms or an alkoxy having 1 to 6 carbon atoms, d and e each independently represents 0 or 1, and $Z^-$ has the same meaning as defined above, and a sulfonium salt of the formula (VIIc)

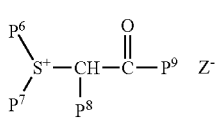

wherein $P^6$ and $P^7$ each independently represents an alkyl having 1 to 6 carbon atoms or a cycloalkyl having 3 to 10 carbon atoms, or $P^6$ and $P^7$ bond to form divalent acyclic hydrocarbon having 3 to 7 carbon atoms which forms a ring together with the adjacent $S^+$, and at least one —$CH_2$— in the divalent acyclic hydrocarbon may be substituted by —CO—, —O— or —S—, $P^8$ represents a hydrogen, $P^9$ represents an alkyl having 1 to 6 carbon atoms, a cycloalkyl having 3 to 10 carbon atoms or aromatic ring group optionally substituted, or $P^8$ and $P^9$ bond to form 2-oxocycloalkyl together with the adjacent —CHCO—, and $Z^-$ has the same meaning as defined above.

<8> The Composition According to <7> Wherein $Z^-$ is an Anion of the Formula (VIII)

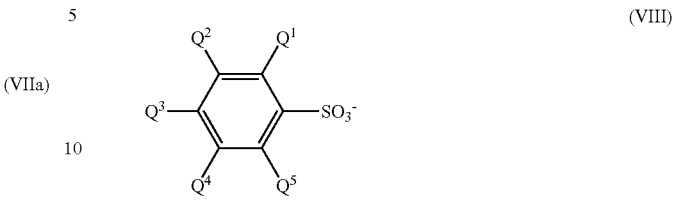

wherein $Q^1$, $Q^2$, $Q^3$, $Q^4$ and $Q^5$ each independently represents a hydrogen, an alkyl having 1 to 16 carbon atoms, an alkoxy having 1 to 16 carbon atoms, a halogen, a haloalkyl having 1 to 8 carbon atoms, an aryl having 6 to 12 carbon atoms, an aralkyl having 7 to 12 carbon atoms, a cyano, an alkylthio having 1 to 4 carbon atoms, an alkylsulfonyl having 1 to 4 carbon atoms, a hydroxyl, a nitro or a group of the formula (VIII')

—COO—X—$Cy^1$     (VIII')

wherein X represents an alkylene and at least one —$CH_2$— in the alkylene may be substituted by —O— or —S—, $Cy^1$ represents an alicyclic hydrocarbon having 3 to 20 carbon atoms.

<9> The Composition According to <8> wherein $Z^-$ is an Anion of the Formula (IXa)

wherein $Q^6$ represents a perfluoroalkyl having 1 to 20 carbon atoms, an optionally substituted naphtyl having 10 to 20 carbon atoms or an optionally substituted anthryl having 10 to 20 carbon atoms, or an anion of the formula (IXb)

wherein $Q^7$ and $Q^8$ each represents a perfluoroalkyl having 1 to 20 carbon atoms or an optionally substituted aromatic group having 6 to 20 carbon atoms.

<10> The Composition According to Any One of <1> to <9> Wherein the Content of the Resin is 80 to 99.9% by Weight and the Content of the Acid Generator is 0.1 to 20% by Weight Based on the Total Amount of the Resin and the Acid Generator.

<11> The Composition According to Any One of <1> to <10> Wherein the Composition Further Comprises Basic Nitrogen-containing Organic Compound as a Quencher.

<12> The Composition According to <11> Wherein the Content of the Basic Nitrogen-containing Organic Compound is 0.001 to 1 Part by Weight per 100 Parts by Weight of the Resin.

DESCRIPTION OF PREFERRED EMBODIMENTS

The present composition comprises (A) a resin which comprises (i) 5 to 50% by mol of a structural unit of the formula (I), (ii) 5 to 50% by mol of a structural unit of the formula (II), and (iii) 5 to 50% by mol of at least one selected from the group consisting of structural units of the formulas (III) and (IV), and (B) an acid generator.

Hereinafter, "a resin which comprises (i) 5 to 50% by mol of a structural unit of the formula (I), (ii) 5 to 50% by mol of a structural unit of the formula (II), and (iii) 5 to 50% by mol of at least one selected from the group consisting of structural units of the formulas (III) and (IV)" may be referred to as "Resin (A)".

Resin (A) itself is insoluble or poorly soluble in an alkali aqueous solution but becomes soluble in an alkali aqueous solution by the action of an acid. Specifically some group(s) in structural unit(s) constructing Resin (A) is (are) dissociated by an acid, and the resin component becomes soluble in an alkali aqueous solution after the dissociation.

In the structural unit of the formula (I), $R^1$ represents a hydrogen or a methyl, $R^2$ represents an alkyl, $R^{10}$ represents a halogen, a hydroxy, an alkyl or an alkoxy, n represents an integer of 0 to 3 and when n is 2 or 3, each of $R^{10}$ is the same or different. Examples of alkyl in $R^2$ includes linear or branched alkyl having 1 to 5 carbon atoms, such as methyl, ethyl, propyl, isopropyl, butyl, isobutyl, sec-butyl, tert-butyl, pentyl, isopentyl, 1-ethylpropyl, 1-methylbutyl, and the like. Examples of halogen in $R^{10}$ include fluorine, chlorine, bromine, iodine, and the like. Examples of alkyl in $R^{10}$ include linear or branched alkyl having 1 to 4 carbon atoms, such as methyl, ethyl, propyl, isopropyl, butyl, isobutyl, sec-butyl and tert-butyl. Examples of alkoxy in $R^{10}$ include linear or branched alkyloxy having 1 to 4 carbon atoms, such as methoxy, ethoxy, propoxy, isopropoxy, butoxy, isobutoxy, sec-butoxy and tert-butoxy.

As described later in the production method of Resin (A) in detail, the structural unit of the formula (I) in Resin (A) can be formed by polymerizing a monomer of the formula (I')

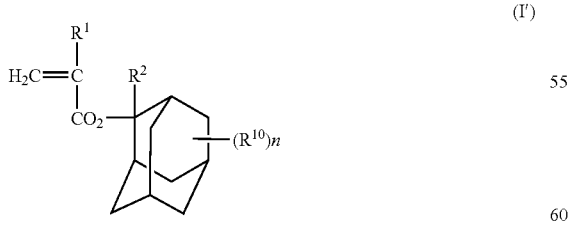

(I')

wherein $R^1$, $R^2$, $R^{10}$ and n have the same meanings as defined above, with other monomers.

Specific examples of the monomer of the formula (I') in which $R^2$ is alkyl having 1 to 5 carbon atoms include the followings:

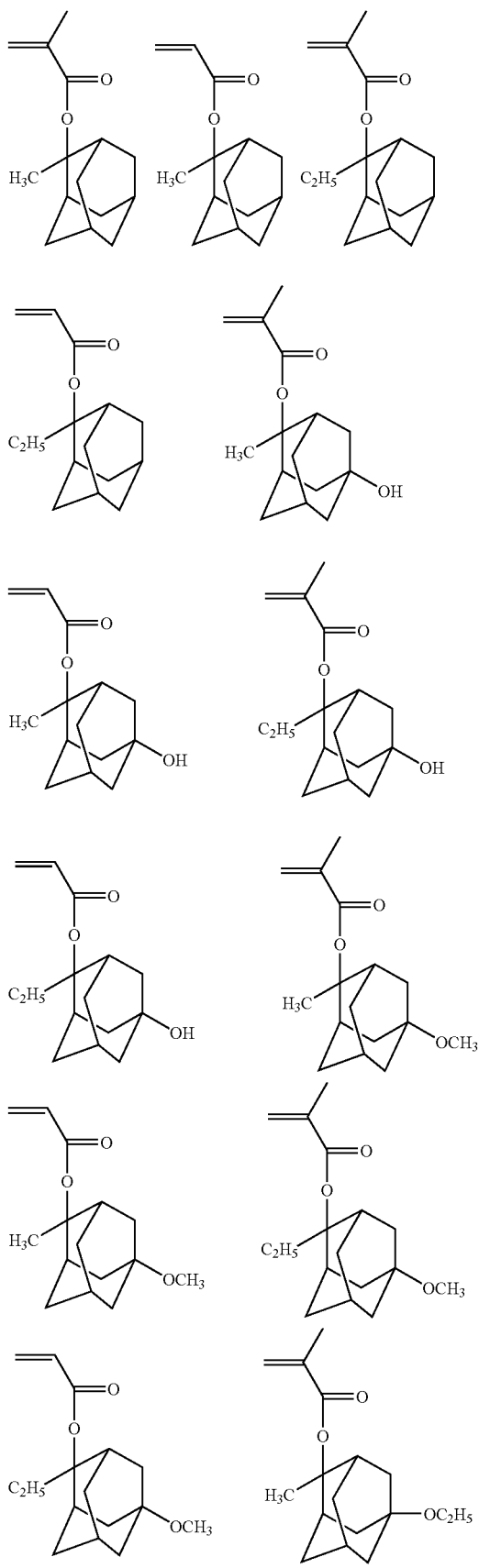

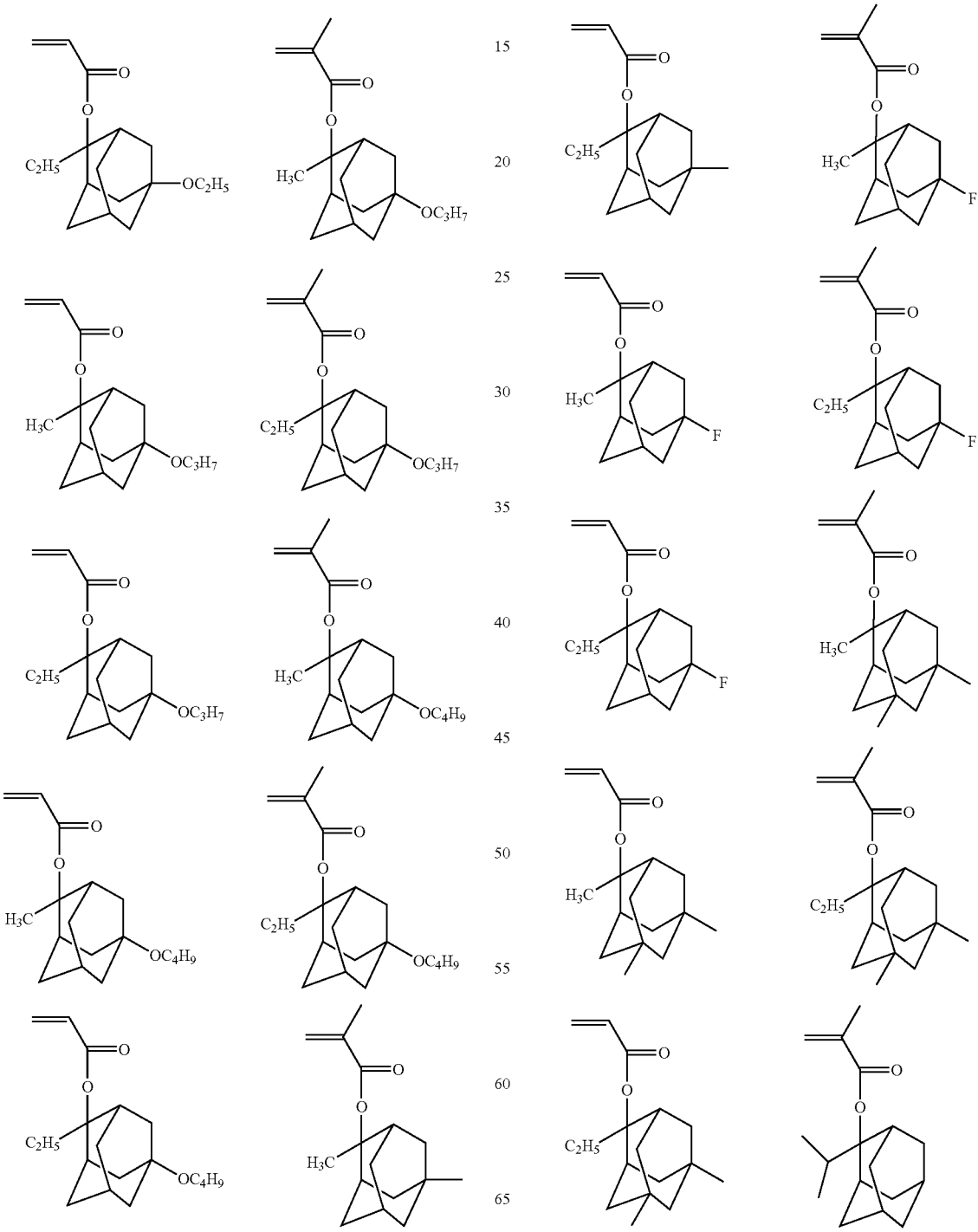

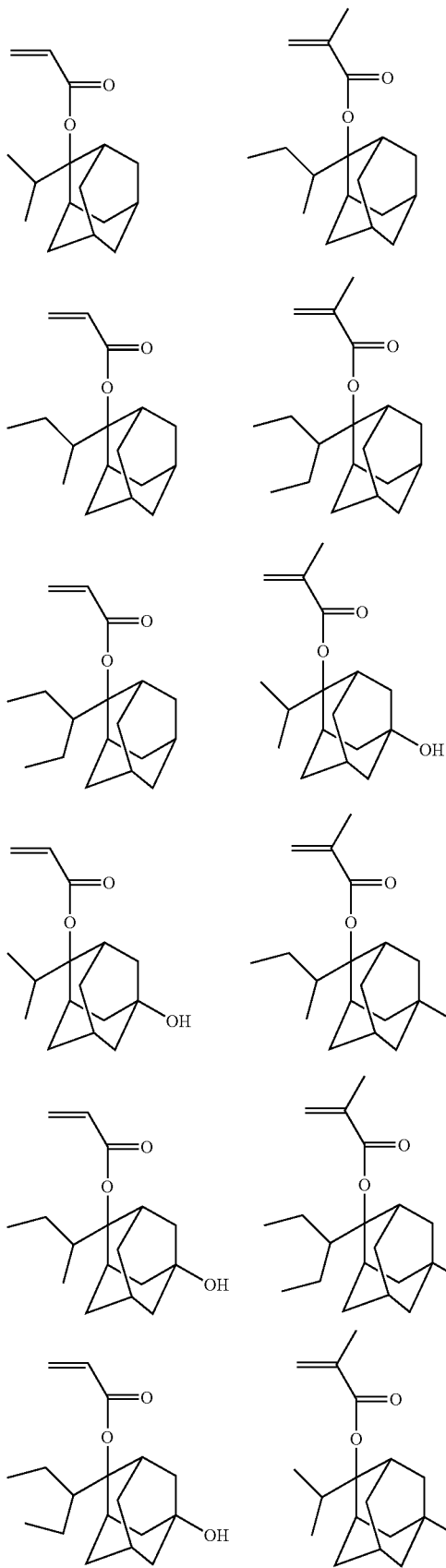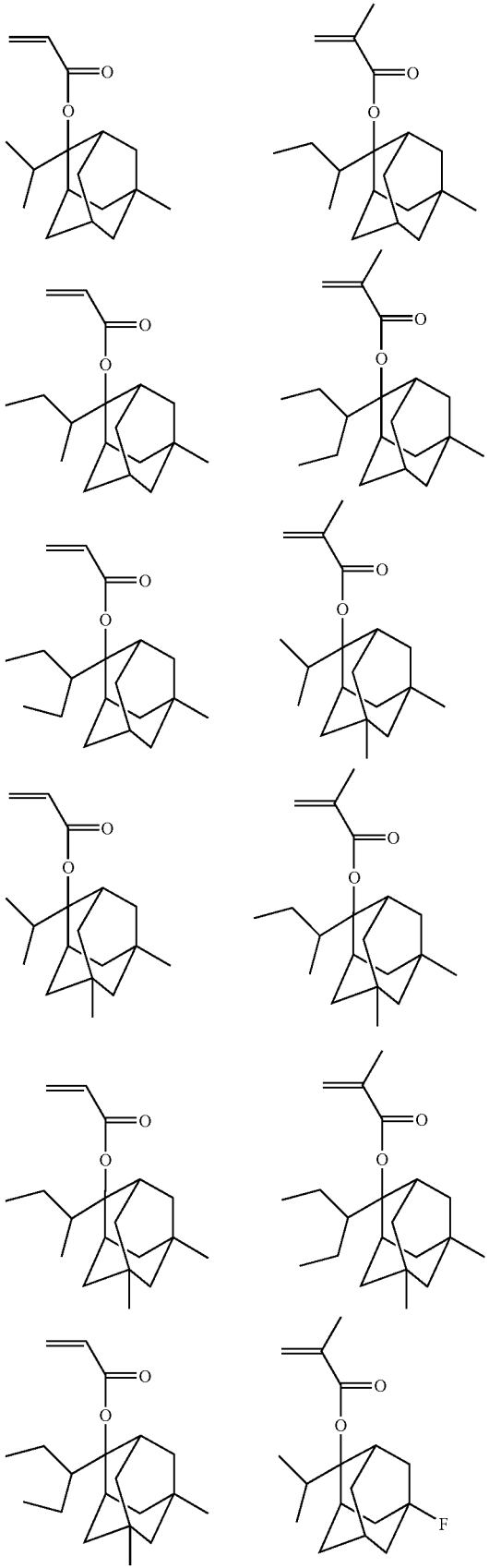

-continued

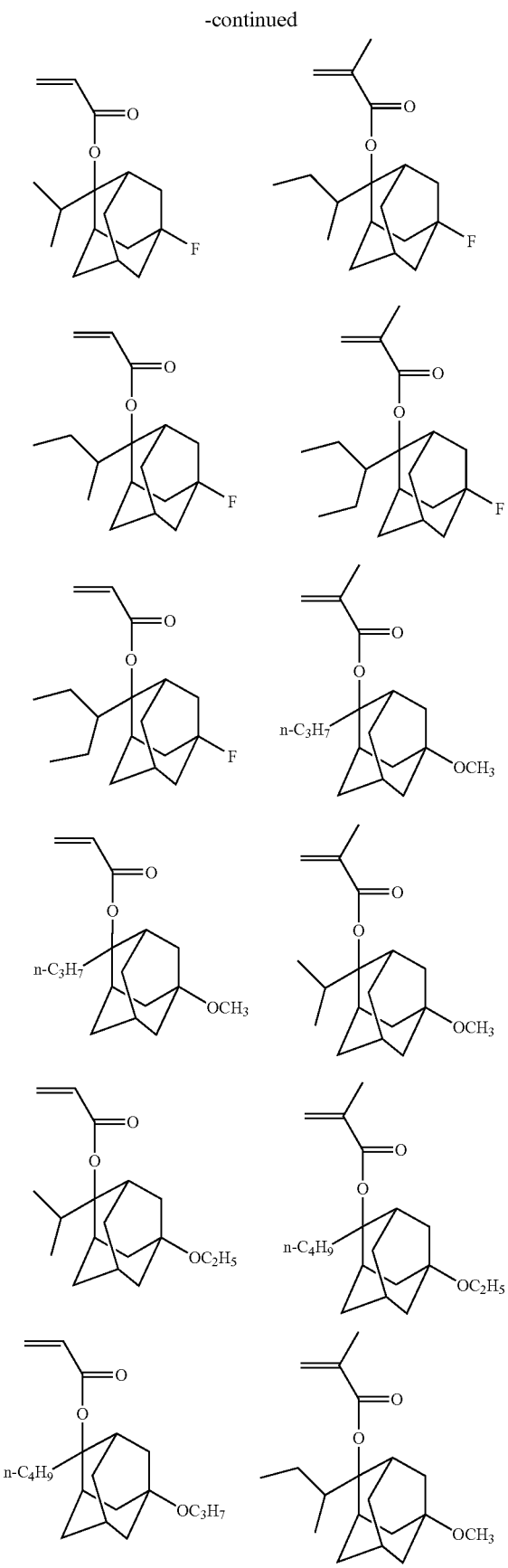

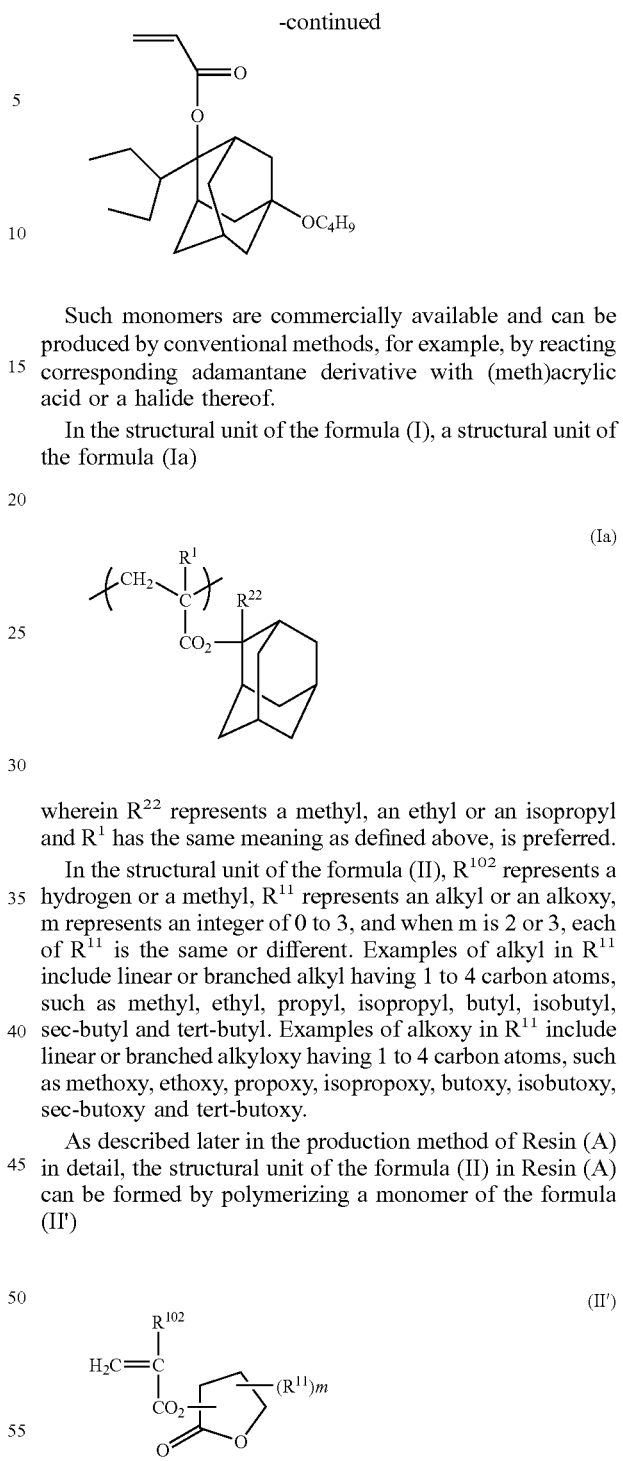

Such monomers are commercially available and can be produced by conventional methods, for example, by reacting corresponding adamantane derivative with (meth)acrylic acid or a halide thereof.

In the structural unit of the formula (I), a structural unit of the formula (Ia)

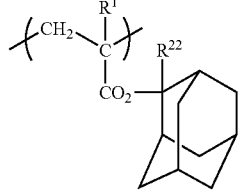

(Ia)

wherein $R^{22}$ represents a methyl, an ethyl or an isopropyl and $R^1$ has the same meaning as defined above, is preferred.

In the structural unit of the formula (II), $R^{102}$ represents a hydrogen or a methyl, $R^{11}$ represents an alkyl or an alkoxy, m represents an integer of 0 to 3, and when m is 2 or 3, each of $R^{11}$ is the same or different. Examples of alkyl in $R^{11}$ include linear or branched alkyl having 1 to 4 carbon atoms, such as methyl, ethyl, propyl, isopropyl, butyl, isobutyl, sec-butyl and tert-butyl. Examples of alkoxy in $R^{11}$ include linear or branched alkyloxy having 1 to 4 carbon atoms, such as methoxy, ethoxy, propoxy, isopropoxy, butoxy, isobutoxy, sec-butoxy and tert-butoxy.

As described later in the production method of Resin (A) in detail, the structural unit of the formula (II) in Resin (A) can be formed by polymerizing a monomer of the formula (II')

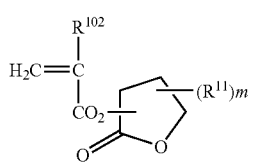

(II')

wherein $R^{102}$, $R^{11}$ and m have the same meanings as defined above, with other monomers.

Specific examples of the monomer of the formula (II') include α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl-γ-butyrolactone, α-methacryloyloxy-α-methyl-γ-butyrolactone, β-acryloyloxy-γ-butyrolactone, β-methacryloyloxy-γ-butyrolactone, β-methacryloyloxy-α-methyl-γ-butyrolactone, α-methacryloyloxy-β-methoxy-γ-butyrolactone, α-acryloyloxy-β-methoxy-γ-butyrolactone, and the like.

In the structural unit of the formula (II), a structural unit of the formula (IIa)

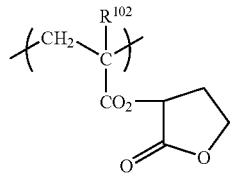

(IIa)

wherein $R^{102}$ has the same meaning as defined above, is preferred.

Such monomers are commercially available and can be produced by conventional methods, for example, by reacting corresponding butyrolactone derivative with (meth)acrylic acid or a halide thereof.

In the structural units of the formulas (III) and (IV), $R^{103}$ and $R^{104}$ each independently represents a hydrogen or a methyl, $R^3$ and $R^4$ each independently represents an alkyl, $R^{12}$ and $R^{13}$ each independently represents an alkyl or an alkoxy, p and q each independently represents an integer of 0 to 3, when p is 2 or 3, each of $R^{12}$ is the same or different, and when q is 2 or 3, each of $R^{13}$ is the same or different. Examples of alkyl in $R^3$ and $R^4$ include linear or branched alkyl having 1 to 5 carbon atoms, such as methyl, ethyl, propyl, isopropyl, butyl, isobutyl, sec-butyl, tert-butyl, pentyl, isopentyl, 1-ethylpropyl, 1-methylbutyl, and the like. Examples of alkyl in $R^{12}$ and $R^{13}$ includes linear or branched alkyl having 1 to 5 carbon atoms, such as methyl, ethyl, propyl, isopropyl, butyl, isobutyl, sec-butyl, tert-butyl, pentyl, isopentyl, 1-ethylpropyl, 1-methylbutyl, and the like. Examples of alkoxy in $R^{12}$ and $R^{13}$ include linear or branched alkyloxy having 1 to 4 carbon atoms, such as methoxy, ethoxy, propoxy, isopropoxy, butoxy, isobutoxy, sec-butoxy and tert-butoxy.

As described later in the production method of Resin (A) in detail, at least one structural unit selected from the group consisting of the structural units of the formulas (III) and (IV) in Resin (A) can be formed by polymerizing at least one monomer selected from the group consisting of the monomers of the formulas (III') and (IV')

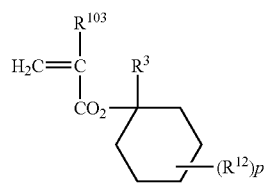

(III')

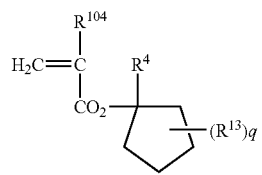

(IV')

wherein $R^{103}$, $R^{104}$, $R^3$, $R^4$, $R^{12}$ and $R^{13}$ have the same meanings above, with other monomers.

Specific examples of the monomer of the formulas (III') and (IV') in which $R^{12}$ and $R^{13}$ are alkyls having 3 to 5 carbon atoms include the followings:

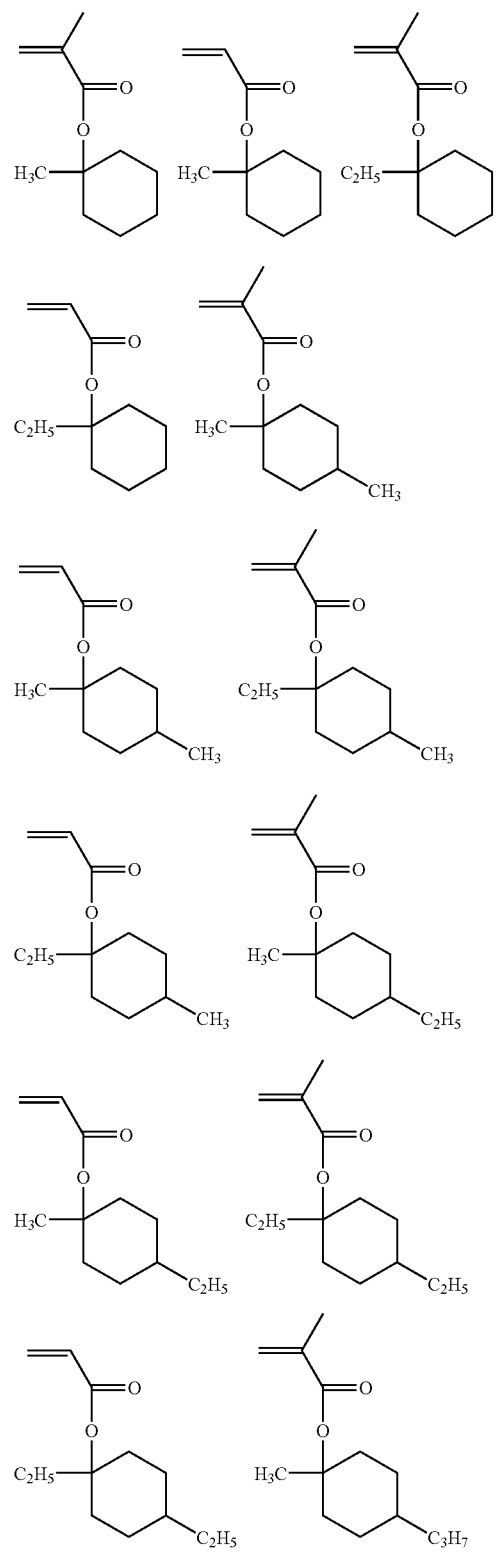

-continued
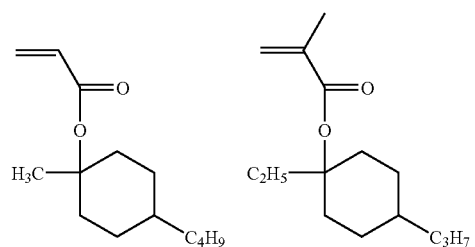
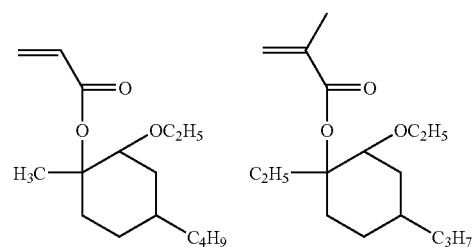
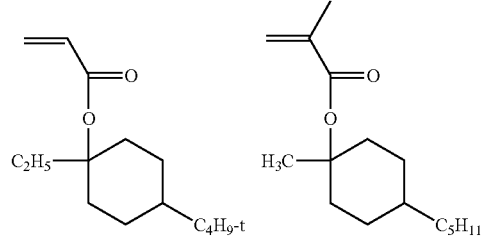
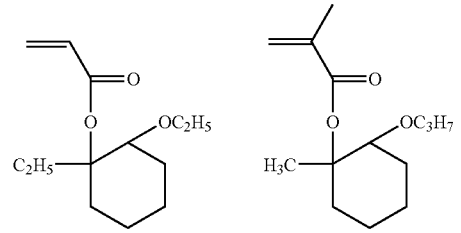
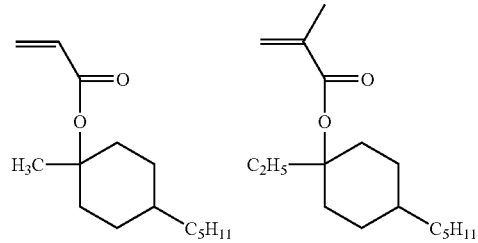
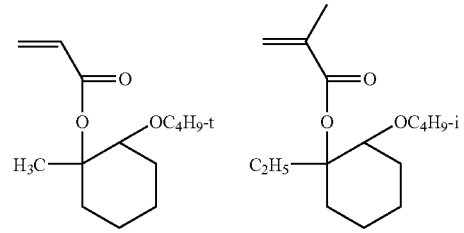
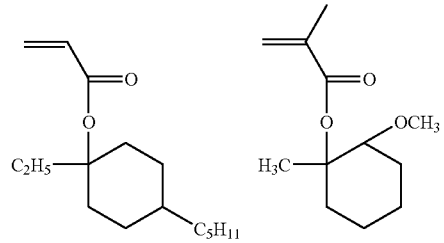
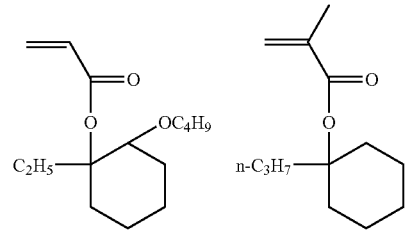
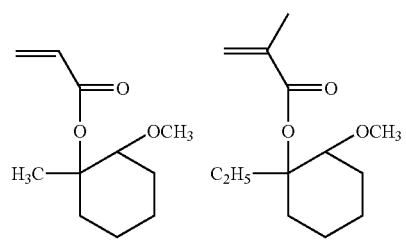
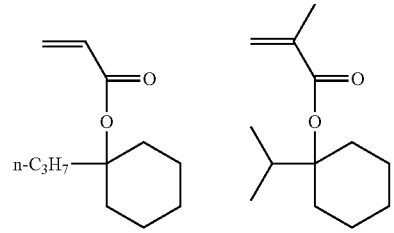
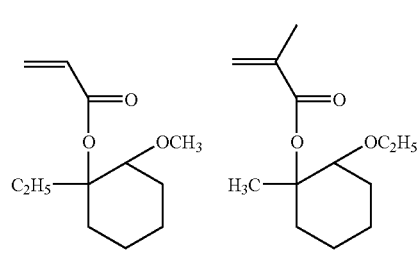
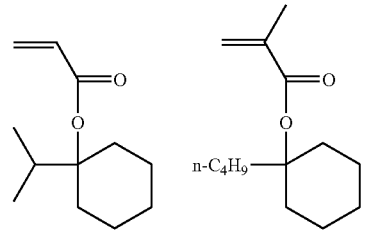
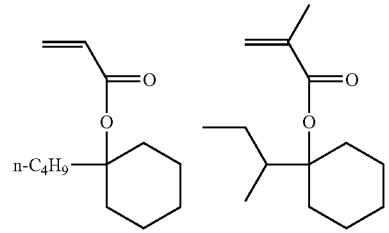

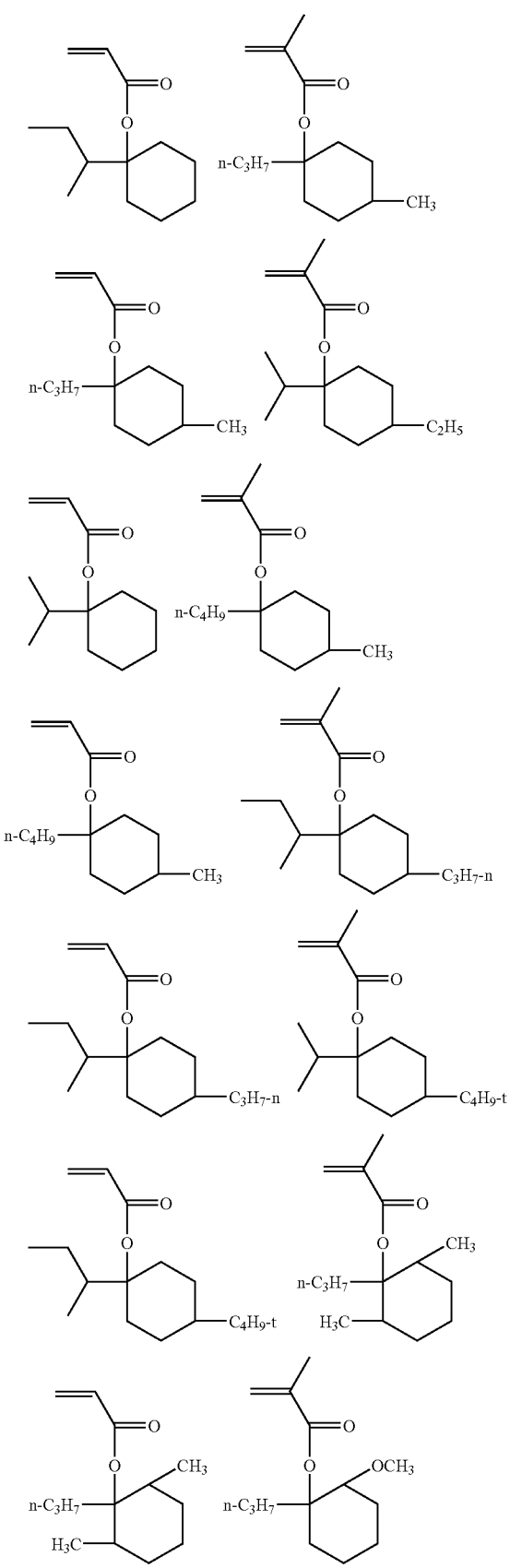

-continued
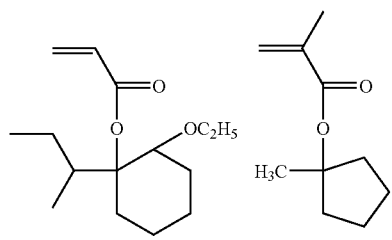
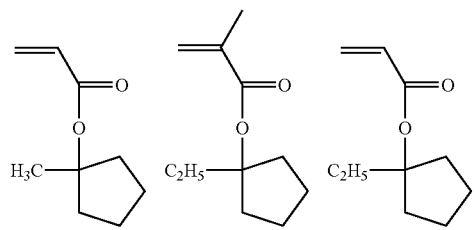
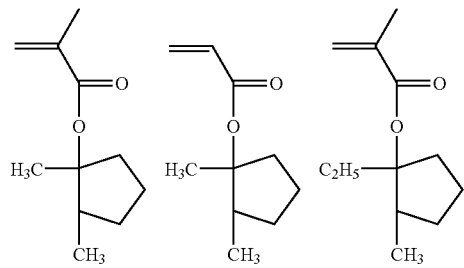
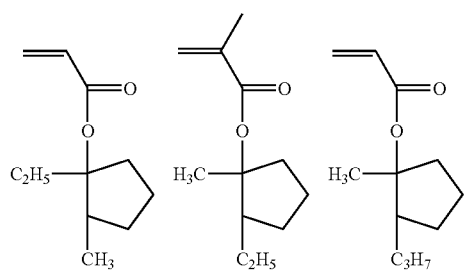
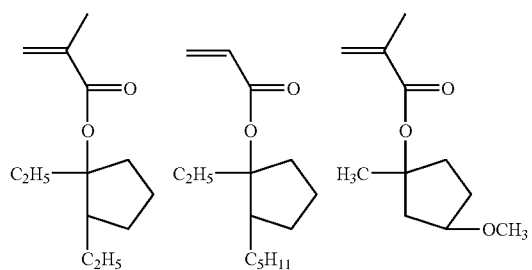
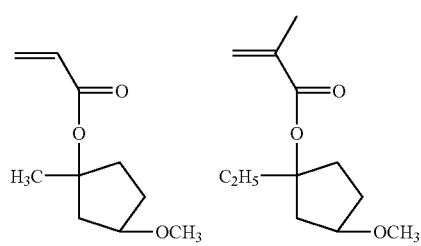
-continued
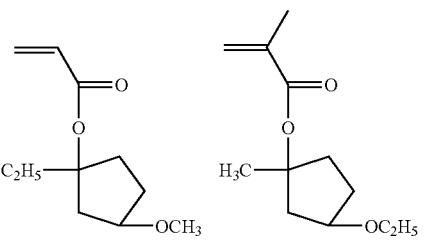
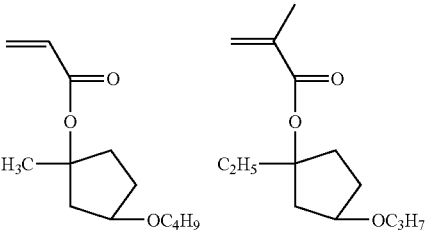
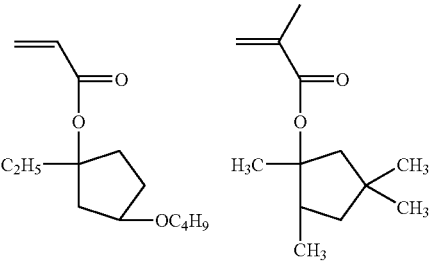
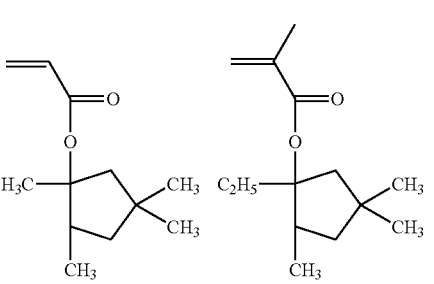
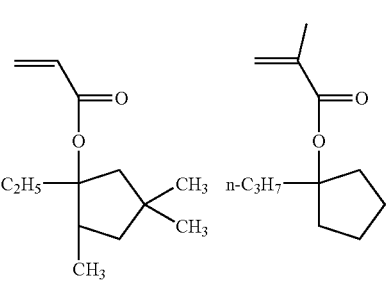
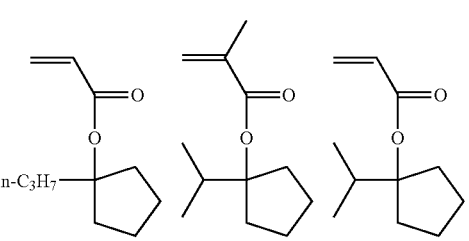

-continued
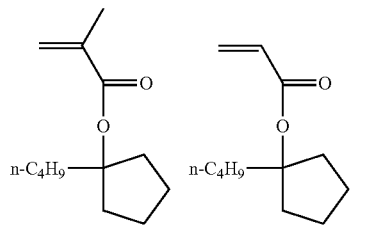
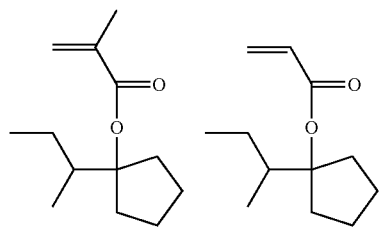
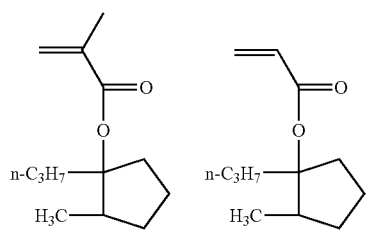
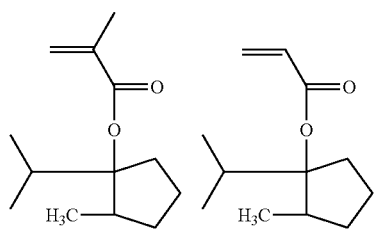
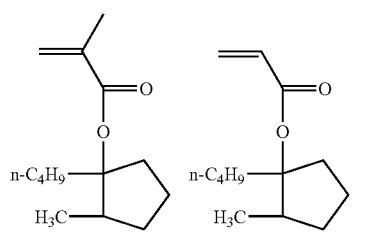
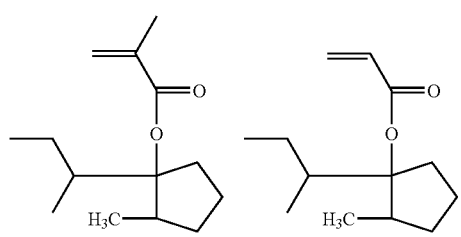
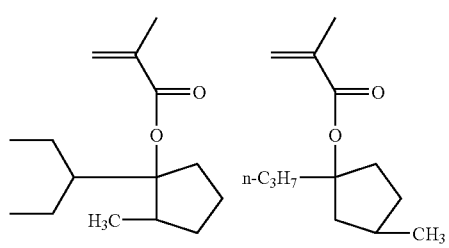
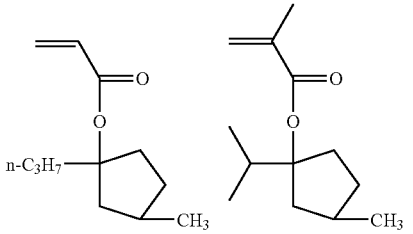
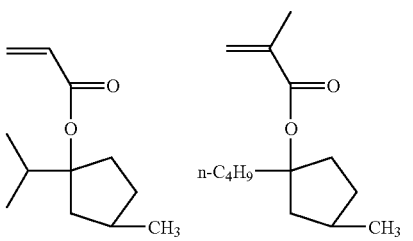
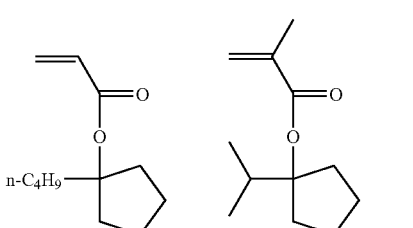
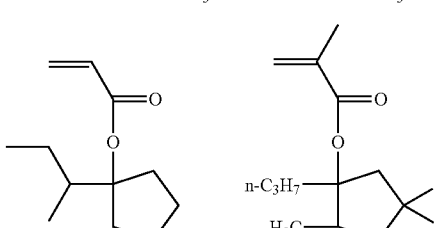
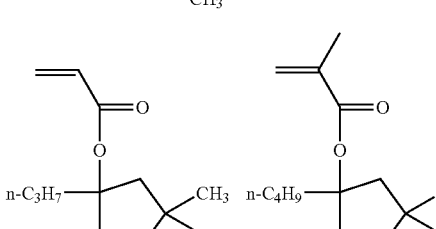
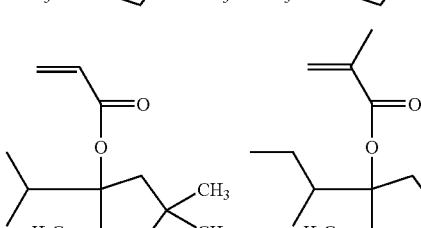
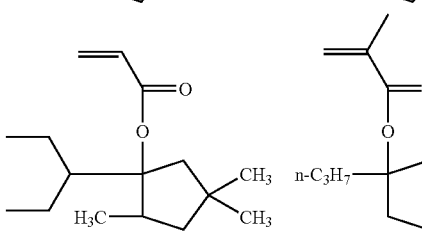

-continued

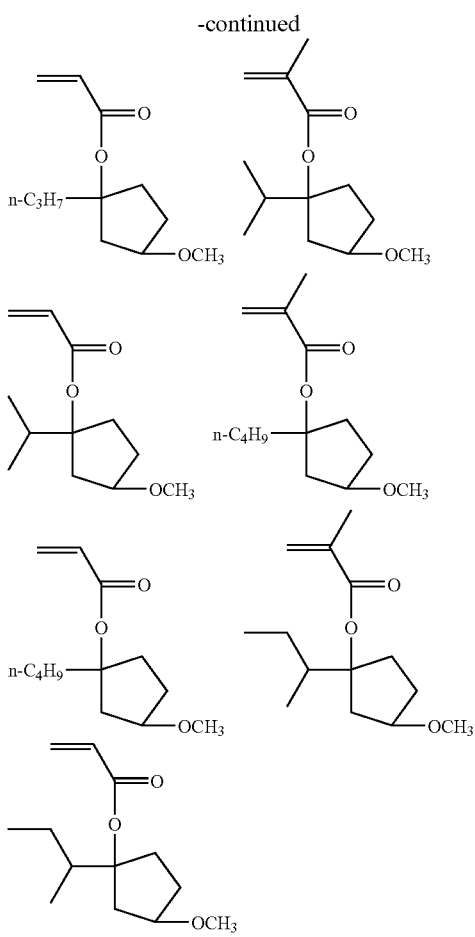

Such monomers are commercially available and can be produced by conventional methods, for example, by reacting corresponding cyclopentyl derivative or cyclohexyl derivative with (meth)acrylic acid or a halide thereof.

In the structural units of the formulas (III) and (IV), structural units of the formulas (IIIa) and (IVa)

(IIIa)

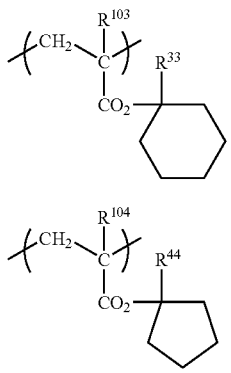

(IVa)

wherein $R^{33}$ and $R^{44}$ represent each independently represents a methyl, an ethyl or an isopropyl, and $R^{103}$ and $R^{104}$ have the same meanings as defined above, are preferred.

As a combination of the structural unit of the formulas (I), (II) and at least one selected from the group consisting of structural units of the formulas (III) and (IV) in Resin (A), a combination of the structural unit of the formulas (I'), (II') and at least one selected from the group consisting of structural units of the formulas (III') and (IV') is preferred.

Resin (A) in the present composition may contain other structural unit(s) than structural units of the formulas (I), (Ia), (II), (Ia), (III), (IIIa), (IV) and (IVa) as long as the effect of the present invention is not prevented.

It is preferred for Resin (A) to contain at least one structural unit selected from the group consisting of structural units of the formulas (V) and (VI) in addition to the structural units of the formulas (I), (II), and at least one selected from the group consisting of the structural units of the formulas (III) and (IV).

In the structural units of the formulas (V) and (VI), $R^{105}$ and $R^{106}$ each independently represents a hydrogen or a methyl, $R^5$ represents a hydroxyl or a hydroxymethyl, $R^{14}$ represents a hydroxyl, an alkyl or an alkoxy, $R^{15}$ represents an alkyl, r and s each independently represents an integer of 0 to 3, when r is 2 or 3, each of $R^{14}$ is the same or different, and when s is 2 or 3, each of $R^{15}$ is the same or different. Examples of alkyl in $R^{14}$ and $R^{15}$ include linear or branched alkyl having 1 to 4 carbon atoms, such as methyl, ethyl, propyl, isopropyl, butyl, isobutyl, sec-butyl and tert-butyl. Examples of alkoxy in $R^{14}$ include linear or branched alkoxy having 1 to 4 carbon atoms, such as methoxy, ethoxy, propoxy, isopropoxy, butoxy, isobutoxy, sec-butoxy and tert-butoxy.

As described later in the production method of Resin (A) in detail, at least one structural unit selected from the group consisting of the structural units of the formulas (V) and (VI) in Resin (A) can be formed by polymerizing at least one monomer selected from the group consisting of the monomers of the formulas (V') and (VI')

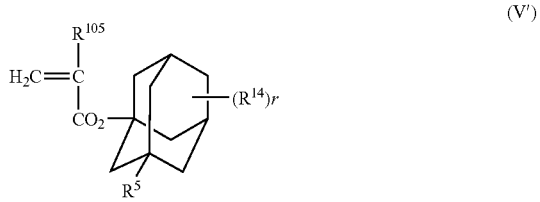

(V')

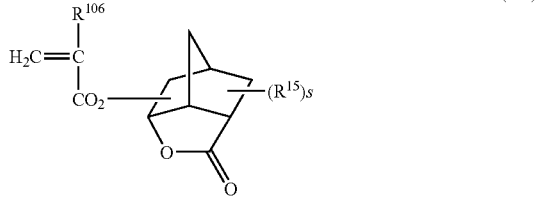

(VI')

wherein $R^{105}$, $R^{106}$, $R^5$, $R^{14}$, $R^{15}$, r and s have the same meanings as defined above, with other monomers.

Specific examples of the monomer of the formula (V') include 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 3-hydroxymethyl-1-adamantyl acrylate, 3-hydroxymethyl-1-adamantyl methacrylate, 3-hydroxy-5,7-dimethyl-1-adamantyl acrylate, 3-hydroxy-5,7-dimethyl-1-adamantyl methacrylate, 3-hydroxy-5,7-dimethoxy-1-adamantyl acrylate, 3-hydroxy-5,7-dimethoxy-1-adamantyl acrylate, and the like.

Such monomers are known and can be produced by conventional methods.

Specific examples of the monomer of the formula (VI') include the followings:

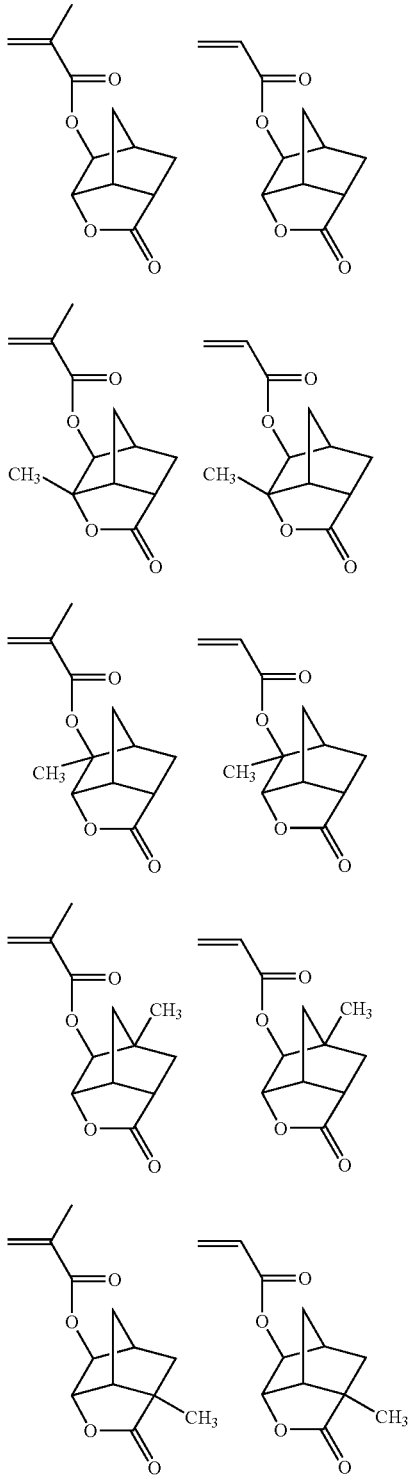

Such monomers are known and can be produced by conventional methods, for example, by reacting the following corresponding alicyclic lactone having hydroxyl with (meth)acrylic acids, and the production method thereof is described in, for example, JP2000-26446-A.

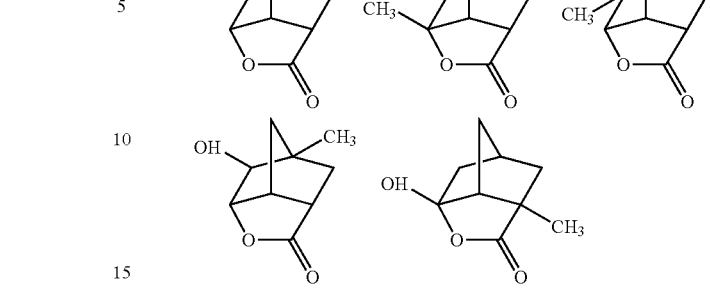

In the structural units of the formulas (V) and (VI), structural units of the formulas (Va) and (VIa)

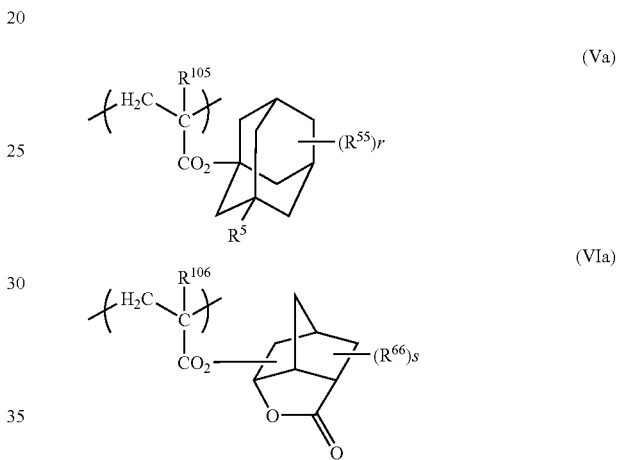

wherein $R^{55}$ represents a hydroxyl, a methyl, an ethyl or a methoxy and $R^{66}$ represent represents a methyl or an ethyl, $R^{105}$, $R^{106}$, r and s have the same meanings as defined above, when r is 2 or 3, each of $R^{55}$ is the same or different, and when s is 2 or 3, each of $R^{66}$ is the same or different, are preferred.

Resin (A) may contain other structural unit having acid-labile group derived from other known (meth)acrylate(s).

Such acid-labile group may be selected from the various groups known as a protective group which itself has ability to suppress dissolution of resin in alkali aqueous solution.

Specific examples of such group include alkoxycarbonyl groups such as methoxycarbonyl, tert-butoxycarbonyl, and the like; an acetal type oxycarbonyl group such as methoxymethoxycarbonyl, ethoxymethoxycarbonyl, 1-ethoxyethoxycarbonyl, 1-isobutoxyethoxycarbonyl, 1-isopropoxyethoxycarbonyl, 1-ethoxypropoxycarbonyl, 1-(2-methoxyethoxy)ethoxycarbonyl, 1-(2-acetoxyethoxy)ethoxycarbonyl, 1-[2-(1-adamantyloxy)ethoxy]ethoxycarbonyl, 1-[2-(1-adamantanecarbonyloxy)ethoxy]ethoxylcarbonyl, 1-[2-(1-adamantanecarbonyloxyl)ethoxy]ethoxycarbonyl, tetrahydro-2-furyloxycarbonyl, tetrahydro-2-pyranyloxycarbonyl, and the like; alicyclic oxycarbonyl groups such as isobornyloxycarbonyl, 1-(1-adamantyl)-1-alkylalkyloxycarbonyl, and the like.

Resin (A) can also contain, other structural units not dissociated or not easily dissociated by the action of an acid. Examples of such other structural units which can be contained include structural units derived from monomers having a free carboxyl group such as acrylic acid and methacrylic acid, structural units derived from aliphatic unsaturated dicarboxylic anhydrides such as maleic anhydride and itaconic anhydride, structural unit derived from 2-norbornene, structural unit derived from (meth)acrylonitrile, structural unit derived from other (meth)acrylates, and the like.

In the case of KrF exposure, there is no problem on light absorption, and a structural unit derived from hydroxystyrene can be further contained.

Resin (A) can be produced by polymerizing monomers of the formulas (I'), (II'), at least one monomer selected from the group consisting of monomer of the formulas (III') and (IV'), and optionally other monomer(s), such as a monomers of the formulas (V), (V'), (VI), (VI'), a monomer which leads to a structural unit having acid-labile group derived from known (meth)acrylate(s), and a monomer which leads to a structural unit not dissociated or not easily dissociated by the action of an acid.

Examples of methods for producing Resin (A) include radical polymerization method, anion polymerization method, coordination polymerization method, and the like, and radical polymerization method is preferred.

As polymerization initiators used therein, the ones effectively generating radicals by heating are preferred. Examples thereof include azo compounds such as 2,2'-azobisisobutyronitrile, dimethyl 2,2'-azobisisobutylate, 2,2'-azobis(2,4-dimethylvaleronitrile), 2,2'-azobis(2-methylbutyronitrile), and the like; organic peroxides such as 2,5-dimethyl-2,5-bis(tert-butylperoxy)hexane, tert-hexyl peroxypivalate, and the like. Each of the polymerization initiator can be used alone or in combination with at least one other kind.

Chain transfer agents such as 1-butanethiol, 2-butanethiol, 1-octanethiol, 1-decanethiol, 1-tetradecanethiol, cyclohexanethiol, 2-methyl-1-propanethiol, and the like, can also be used.

Preferred organic solvents used for the production of Resin (A) are the ones capable of dissolving all of monomers, polymerization initiators and copolymer obtained. Examples thereof include hydrocarbons such as toluene, and the like, 1,4-dioxane, tetrahydrofuran, methyl isobutyl ketone, isopropyl alcohol, γ-butyrolactone, propylene glycol monomethyl ether acetate, ethyl lactate, and the like. Each of the solvent can be used alone or in combination with at least one other kind.

The polymerization temperature is usually 0 to 150° C., preferably 40 to 100° C.

The weight average molecular weight of Resin (A) is preferably 1000 to 100000, and more preferably 5000 to 20000.

Resin (A) contains 5 to 50% by mol of the structural unit of the formula (I), 5 to 50% by mol of the structural unit of the formula (II) and 5 to 50% by mol of at least one selected from the group consisting of the structural units of the formulas (III) and (IV), all based on total of structural units in Resin (A). Total content of the structural units of the formulas (I), (III) and (IV) is generally 10 to 80% by mol.

When Resin (A) contains at least one other structural unit than the structural units of the formulas (I), (II), (III) and (IV), total content of the structural units of the formulas (I), (II), (1.11) and (IV) is generally 15 to 85% by mol, based on total of structural units in Resin (A), though the ratio varies depending on the kind of radiation for patterning exposure, the kind of an acid-labile group, and the like.

When at least one selected from the group consisting of the structural units of the formulas (V) and (VI) is contained in Resin (A), total content thereof is preferably 80% by mol or less, preferably 50% by mol or less based on total of structural units in Resin (A), and total content of the structural units of the formulas (I), (II), (III), (IV), (V) and (VI) is generally 15 to 100% by mol, based on total of structural units in Resin (A).

The ratio of each of the structural units can generally be determined by conventional method, for example, by NMR analysis.

The acid generator, another component of the positive resist composition, is the compound which is decomposed to generate an acid by allowing radioactive ray such as light and electron beam to act on the acid generator itself or a resist composition containing the acid generator. The acid generated from the acid generator acts on Resin (A), to dissociate acid-labile group present in Resin (A).

Such acid generators include, for example, onium salt, organic halogen compounds, sulfone compounds, sulfonate compounds, and the like.

Examples of the acid generator in the present resist composition include a sulfonium salt of the formula (VIIa)

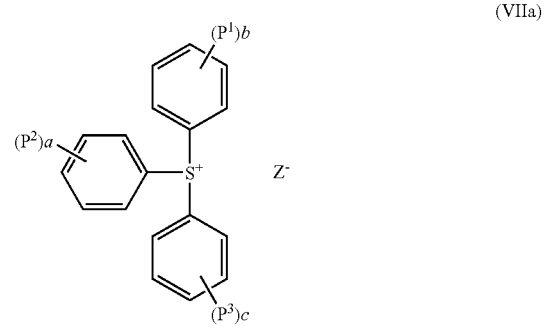

(VIIa)

wherein $P^1$ to $P^3$ each independently represents a hydroxyl, an alkyl having 1 to 6 carbon atoms or an alkoxy having 1 to 6 carbon atoms, a, b and c each independently represents an integer of 0 to 3, when a is 2 or more, each of $P^1$ is the same or different, when b is 2 or more, each of $P^2$ is the same or different, when c is 2 or more, each of $P^3$ is the same or different, and Z represents an organic counter anion;

an iodonium salt of the formula (VIIb)

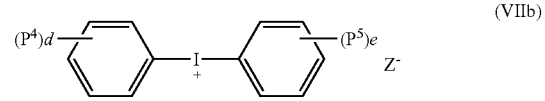

(VIIb)

wherein $P^4$ and $P^5$ each independently represents a hydroxyl, an alkyl having 1 to 6 carbon atoms or an alkoxy having 1 to 6 carbon atoms, d and e each independently represents 0 or 1, and $Z^-$ has the same meaning as defined above; or a sulfonium salt of the formula (VIIc)

(VIIc)

wherein $P^6$ and $P^7$ each independently represents an alkyl having 1 to 6 carbon atoms or a cycloalkyl having 3 to 10 carbon atoms, or P⁶ and P⁷ bond to form divalent acyclic hydrocarbon having 3 to 7 carbon atoms which forms a ring together with the adjacent S⁺, and at least one —CH₂— in the divalent acyclic hydrocarbon may be substituted by —CO—, —O— or —S—, P⁸ represents a hydrogen, P⁹ represents an alkyl having 1 to 6 carbon atoms, a cycloalkyl having 3 to 10 carbon atoms or aromatic ring group optionally substituted, or P⁸ and P⁹ bond to form 2-oxocycloalkyl together with the adjacent —CHCO—, and Z⁻ has the same meaning as defined above.

In P¹, P², P³, P⁴ and P⁵, specific examples of the alkyl include methyl, ethyl, propyl, isopropyl, butyl, tert-butyl, pentyl, hexyl and the like, and examples of the alkoxy include methoxy, ethoxy, propoxy, isopropoxy, butoxy, tert-butoxy and the like.

In P⁶, P⁷ and P⁹, specific examples of the alkyl include methyl, ethyl, propyl, isopropyl, butyl, tert-butyl, pentyl, hexyl and the like, and specific examples of the cycloalkyl include cyclopropyl, cyclobutyl, cyclopentyl, cyclohexyl, cycloheptyl and the like. Specific examples of the ring group formed by adjacent S⁺ and divalent acyclic hydrocarbon by P⁶ and P⁷ include tetrahydrothiophenium group, tetrahydro-2H-thiopyranium group, 1,4-oxathianium group, and the like. In P⁹, specific examples of the aromatic ring group include phenyl, tolyl, xylyl, naphtyl and the like. Specific examples of the 2-oxocycloalkyl formed by bonding P⁸ and P⁹ together with the adjacent —CHCO— include 2-oxocyclohexyl, 2-oxocyclopentyl and the like.

Specific examples of cations of in the formulas (VIIa), (VIIb) or (VIIc) include the followings:

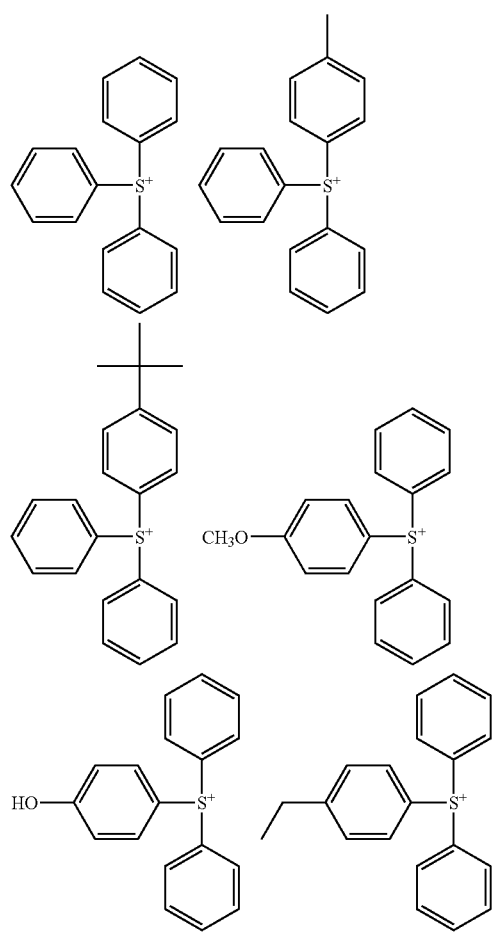

-continued

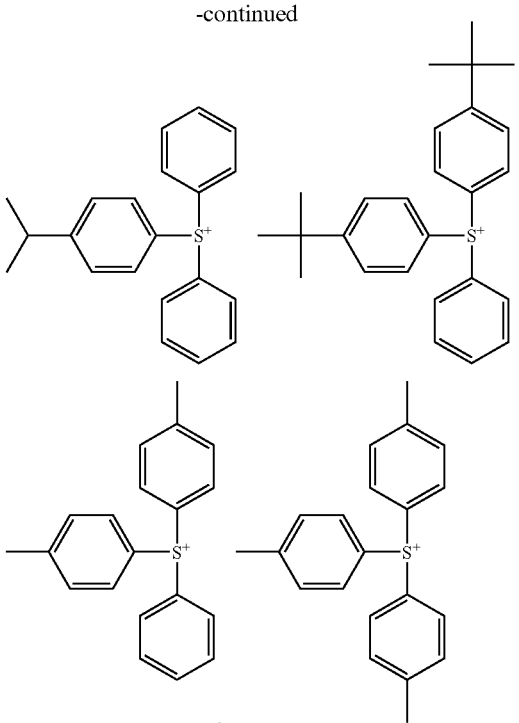

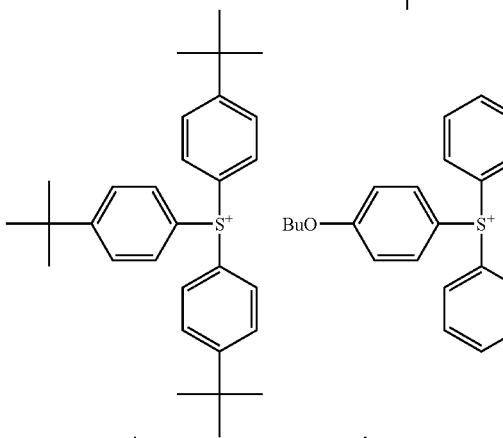

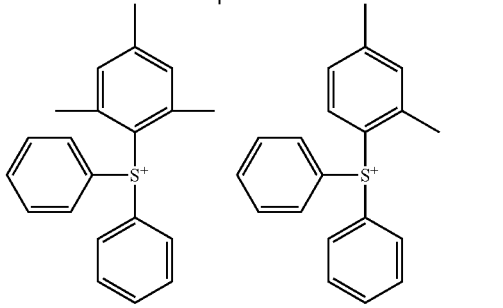

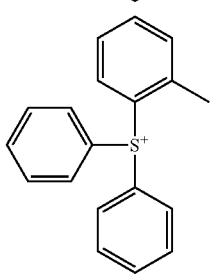

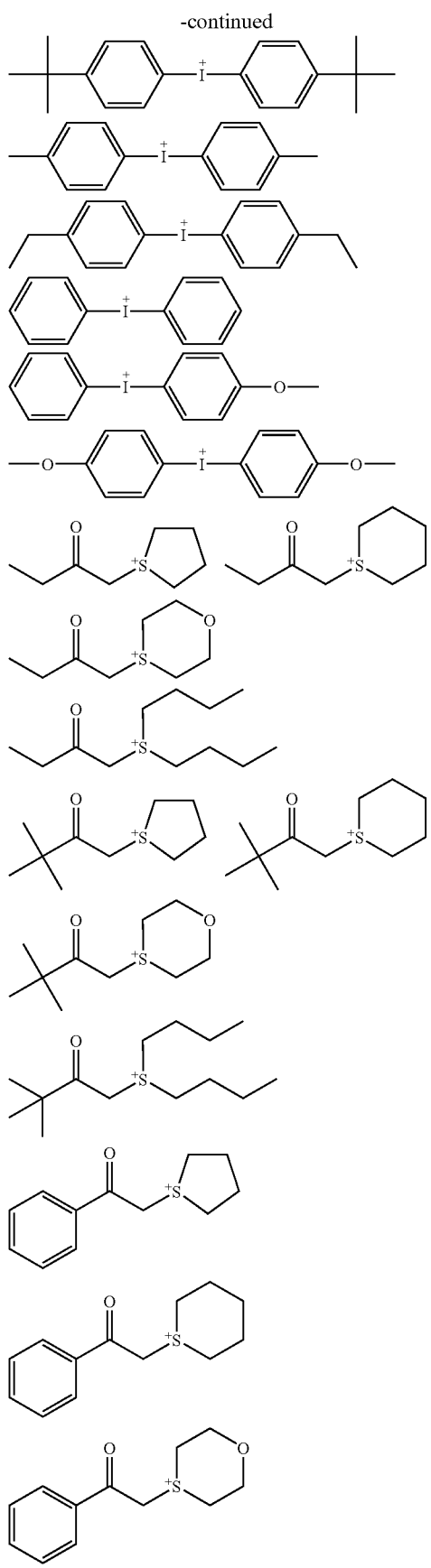

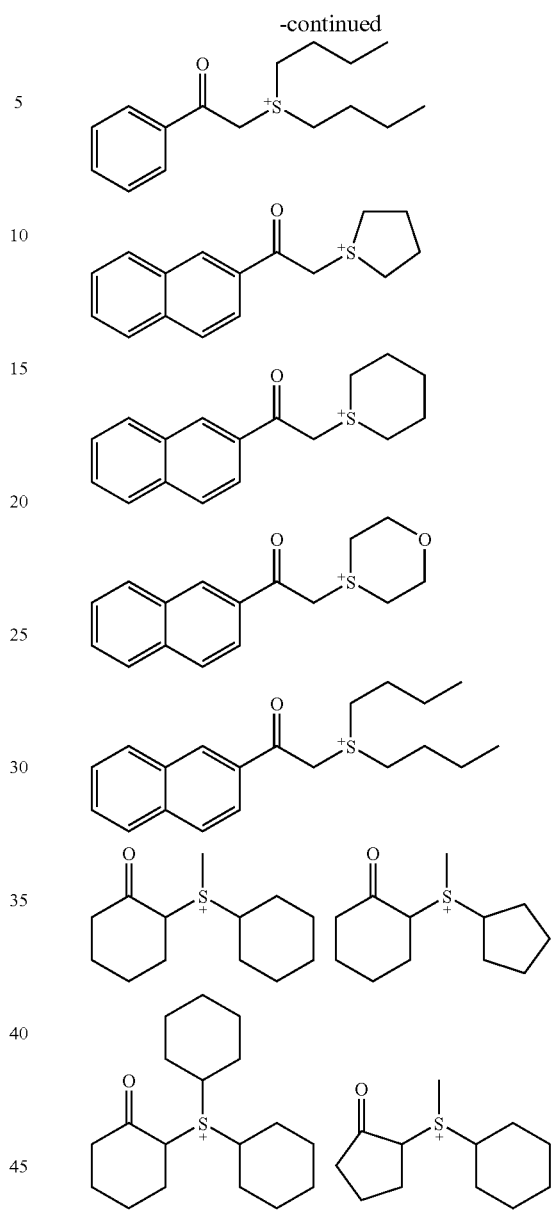

$Z^-$ represents an organic counter anion. Examples of the counter anions include an anion of the formula (VIII)

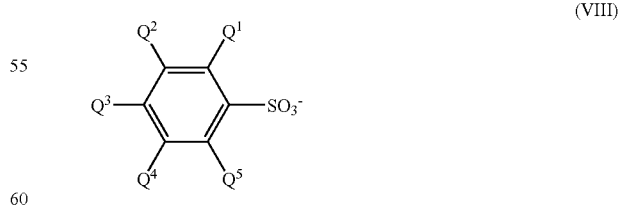

(VIII)

wherein $Q^1$, $Q^2$, $Q^3$, $Q^4$ and $Q^5$ each independently represents a hydrogen, an alkyl having 1 to 16 carbon atoms, an alkoxy having 1 to 16 carbon atoms, a halogen, a haloalkyl having 1 to 8 carbon atoms, an aryl having 6 to 12 carbon atoms, an aralkyl having 7 to 12 carbon atoms, a cyano, an alkylthio having 1 to 4 carbon atoms, an alkylsulfonyl having 1 to 4 carbon atoms, a hydroxyl, a nitro or a group of the formula (VIII')

—COO—X—Cy¹ (VIII')

wherein X represents an alkylene and at least one —CH$_2$— in the alkylene may be substituted by —O— or —S—, Cy¹ represents an alicyclic hydrocarbon having 3 to 20 carbon atoms.

Examples of the alkyl having 1 to 16 carbon atoms include methyl, ethyl, propyl, isopropyl, butyl, tert-butyl, pentyl, hexyl, octyl, decyl, dodecyl, hexadecyl, and the like.

Examples of the alkoxy having 1 to 16 carbon atoms include methoxy, ethoxy, propoxy, isopropoxy, butoxy, tert-butoxy, pentyloxy, hexyloxy, isopentyloxy, decyloxy, dodecyloxy, hexadecyloxy, and the like.

Examples of the haloalkyl having 1 to 8 carbon atoms include trifluoromethyl, perfluoroethyl, perfluoropropyl, perfluoroisopropyl, perfluorobutyl, perfluoroisobutyl, perfluoro-sec-butyl, perfluoro-tert-butyl, perfluorooctyl, and the like.

Examples of halogen include fluorine, chlorine, bromine, iodine, and the like.

Examples of aryl having 6 to 12 carbon atoms include phenyl, tolyl, methoxyphenyl, naphtyl, and the like.

Examples of the aralkyl having 7 to 12 carbon atoms include benzyl, chlorobenzyl, methoxybenzyl, and the like.

Examples of the alkylthio having 1 to 4 carbon atoms include methylthio, ethylthio, propylthio, isopropylthio, butylthio, tert-butylthio, and the like.

Examples of the alkylsulfonyl having 1 to 4 carbon atoms include methylsulfonyl, ethylsulfonyl, propylsulfonyl, isopropylsulfonyl, butylsulfonyl, tert-butylsulfonyl, and the like.

When two or more of $Q^1$, $Q^2$, $Q^3$, $Q^4$ and $Q^5$ are the groups of the formula (VIII'), the groups of the formula (VIII') may be identical or different.

Examples of X include the followings:

 (a-1)

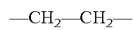 (a-2)

 (a-3)

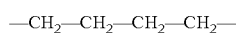 (a-4)

 (a-5)

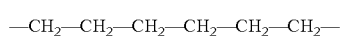 (a-6)

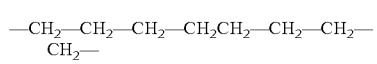 (a-7)

 (a-8)

 (a-9)

 (a-10)

 (a-11)

 (a-12)

 (a-13)

 (a-14)

 (a-15)

As X, (a-1) to (a-7) above are preferred.

Examples of Cy¹ include the followings:

 (b-1)

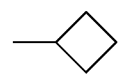 (b-2)

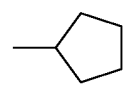 (b-3)

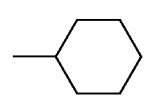 (b-4)

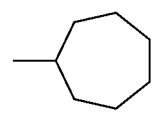 (b-5)

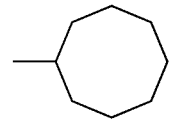 (b-6)

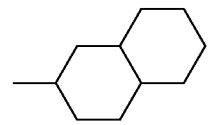 (b-11)

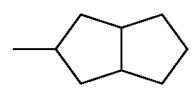 (b-12)

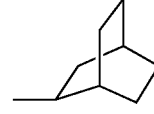 (b-13)

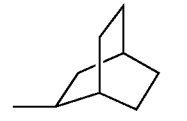 (b-14)

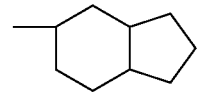 (B-15)

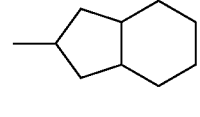 (b-16)

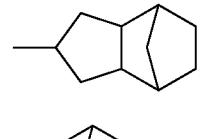 (b-21)

 (b-22)

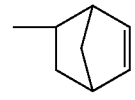

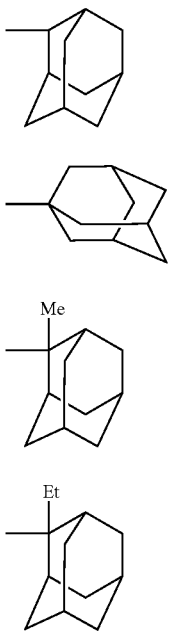
(b-23)
(b-24)
(b-25)
(b-26)
As Cy¹, cyclohexyl (b-4), 2-norbornyl (b-21), 1-adamantyl (b-24) and 2-adamantyl (b-23) are preferred.
Specific examples of the organic counter anion of represented by Z include the followings:
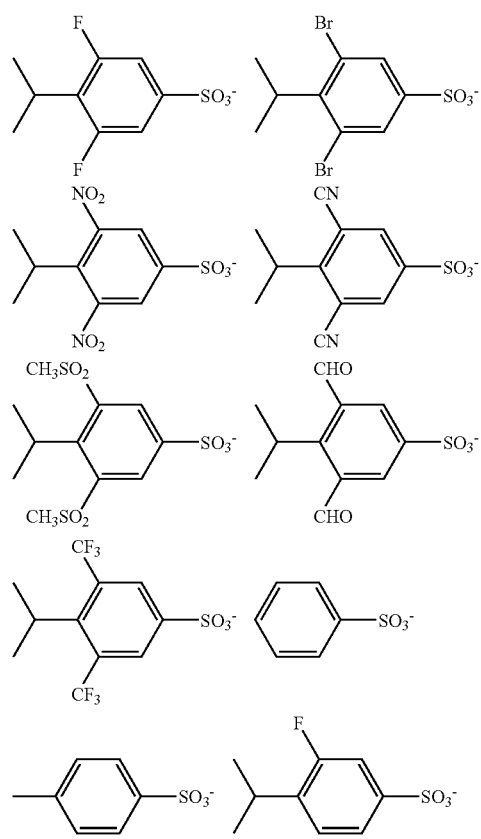
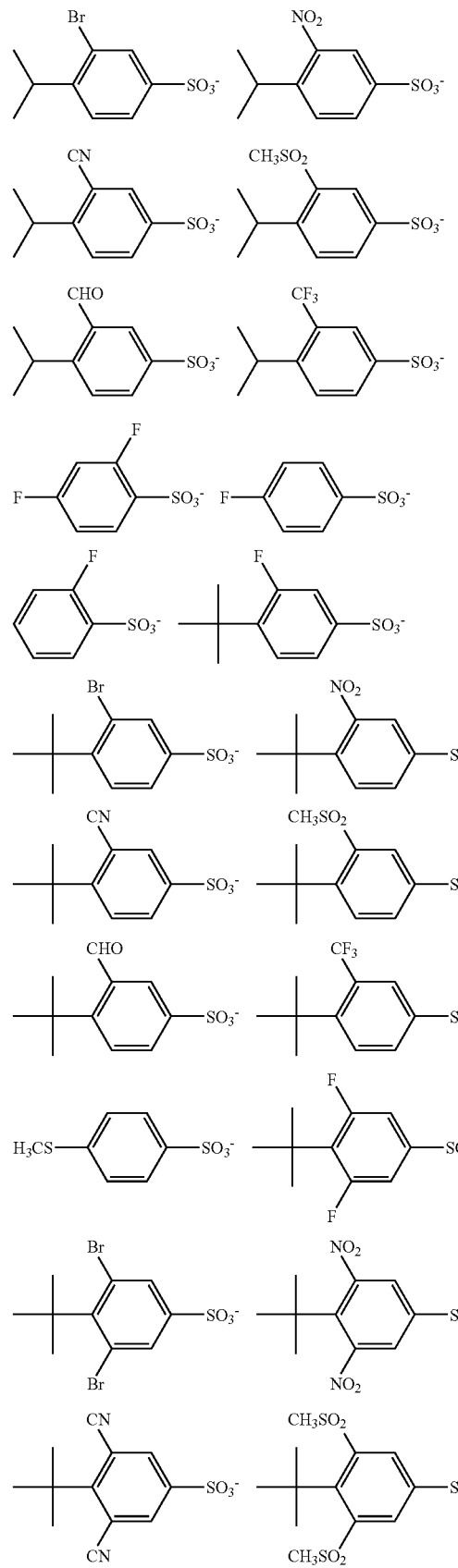

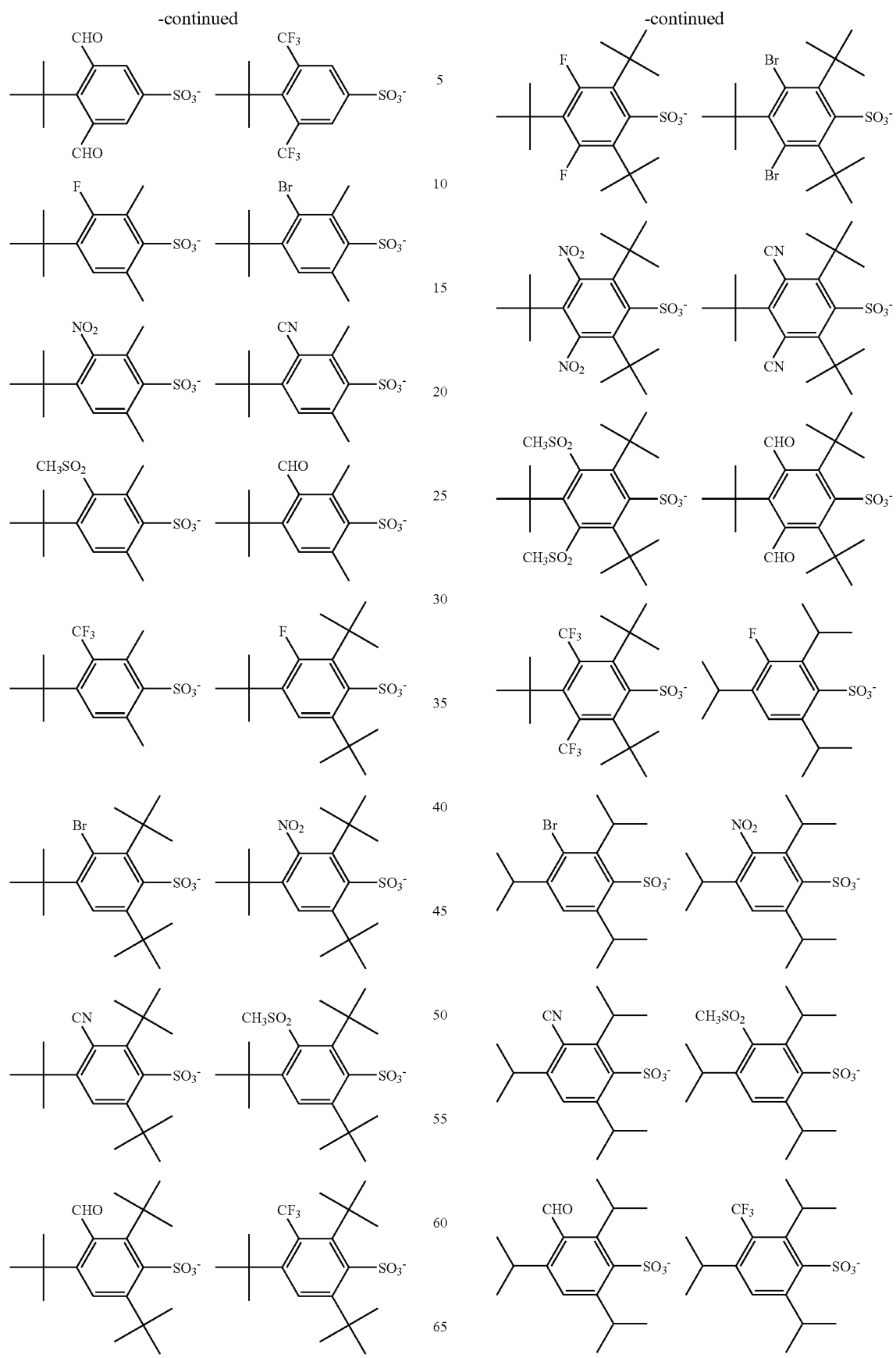

-continued
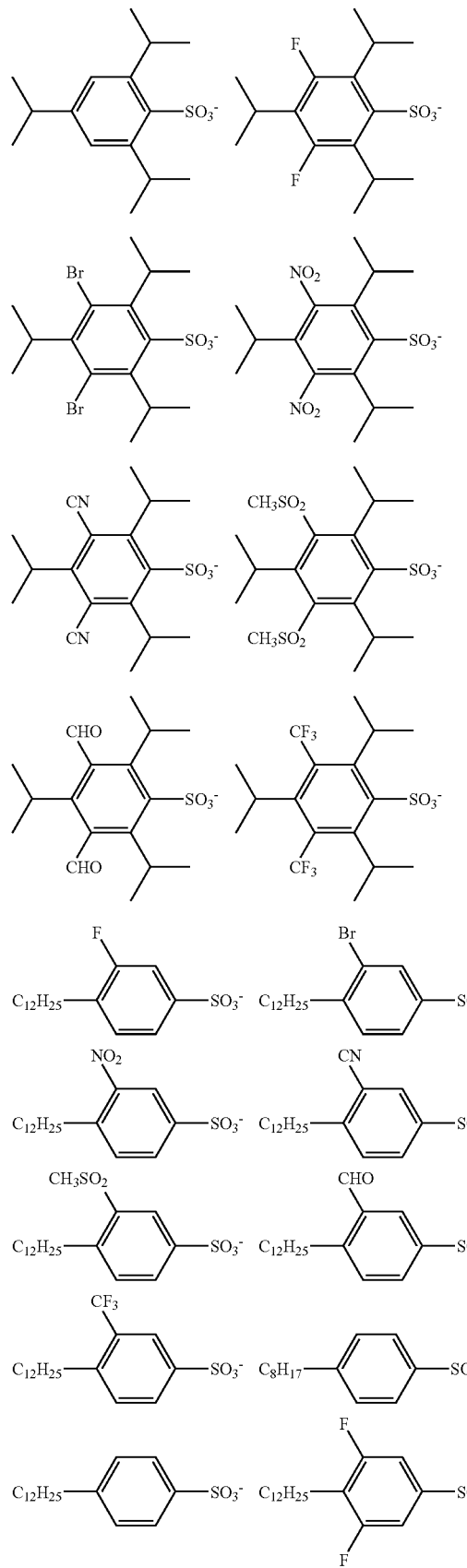
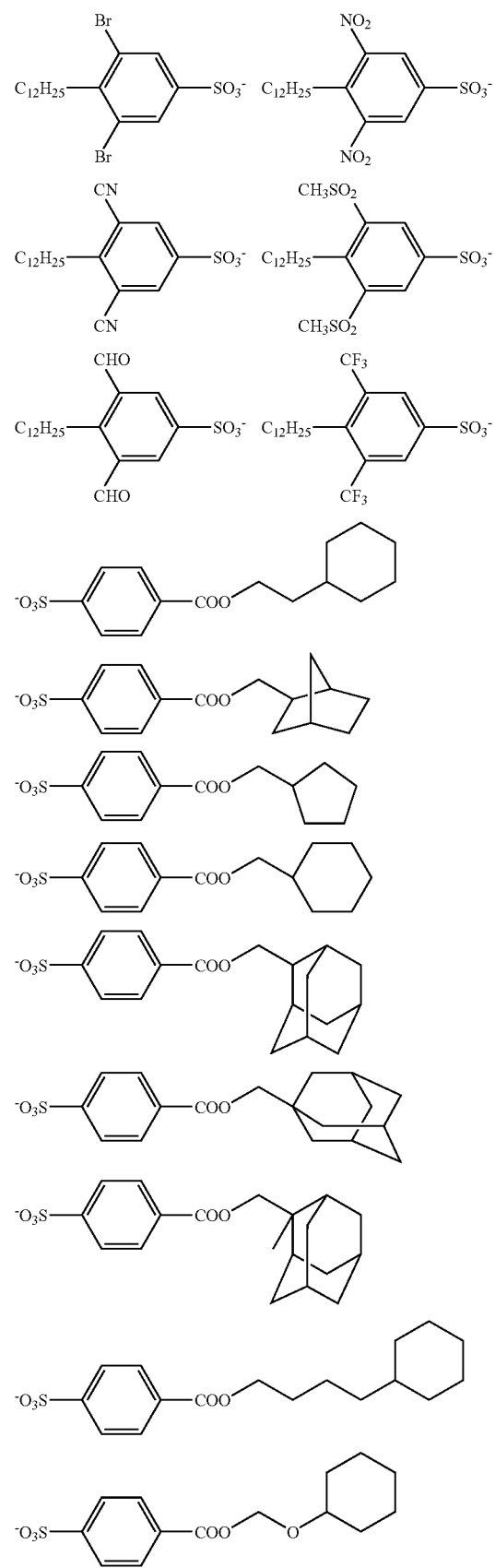

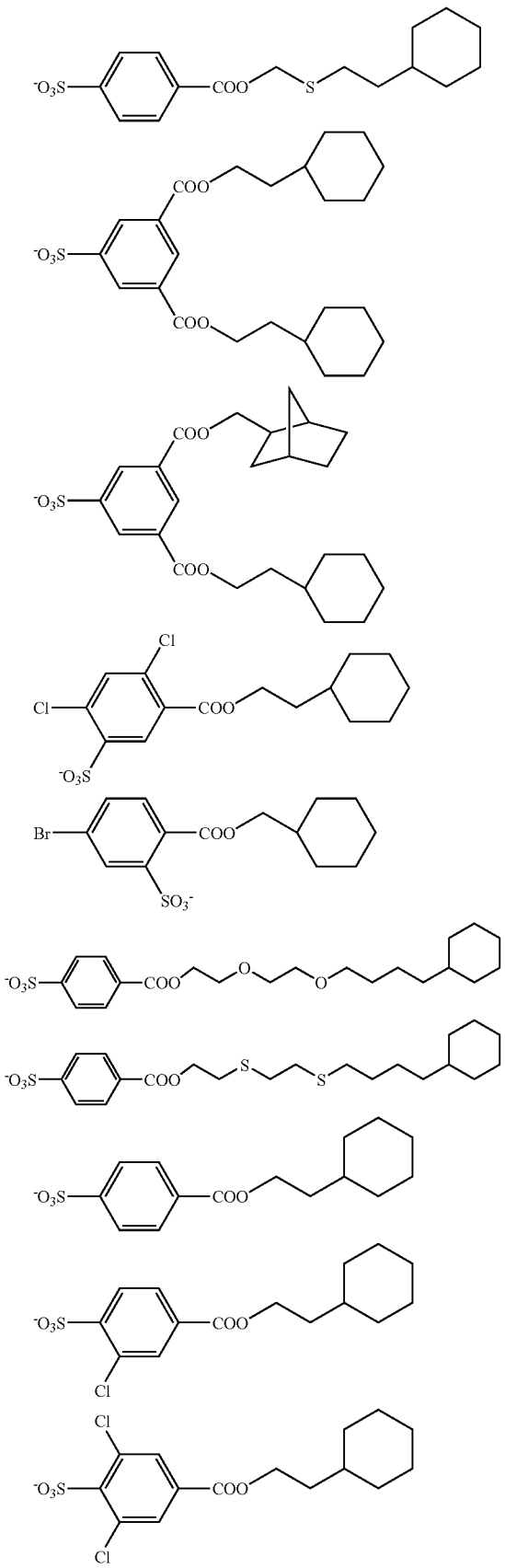
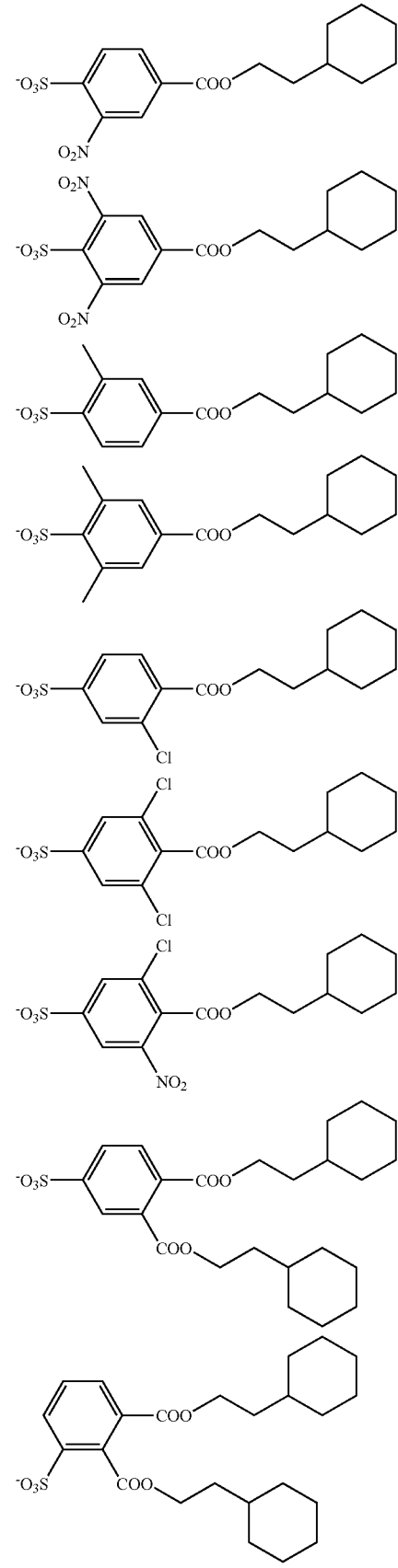

-continued

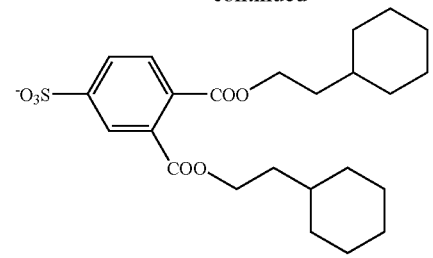

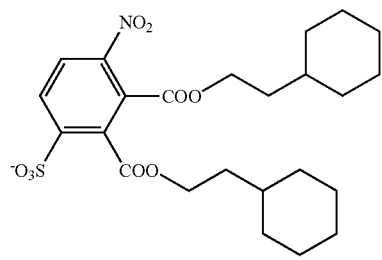

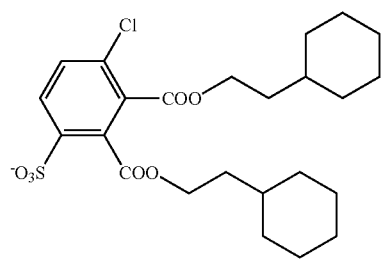

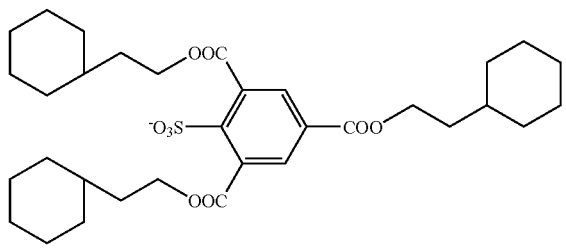

Examples of the other counter anions than the anion of the formula (VIII) include an anion of the formula (IXa)

$$\ominus SO_3-Q^6 \quad \text{(IXa)}$$

wherein $Q^6$ represents a perfluoroalkyl having 1 to 20 carbon atoms, an optionally substituted naphtyl having 10 to 20 carbon atoms or an optionally substituted anthryl having 10 to 20 carbon atoms and an anion of the formula (IXb)

$$Q^7-SO_2-\overset{\ominus}{N}-SO_2-Q^8 \quad \text{(IXb)}$$

wherein $Q^7$ and $Q^8$ each represents a perfluoroalkyl having 1 to 20 carbon atoms or an optionally substituted aromatic group having 6 to 20 carbon atoms.

Specific examples of anion of the formula (IXa) include the followings:

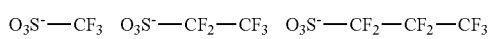
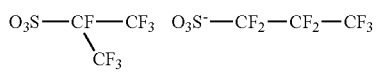
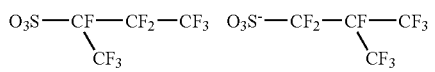
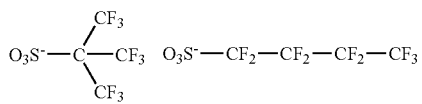
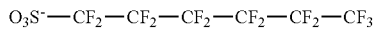
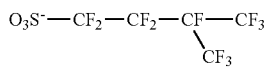
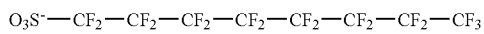
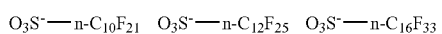
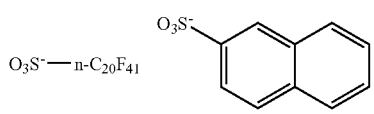
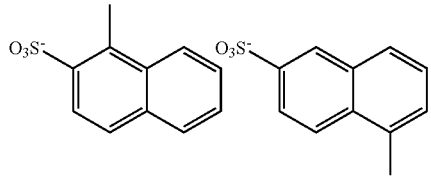
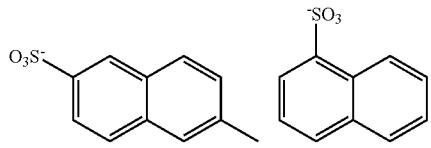
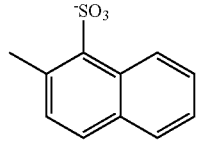
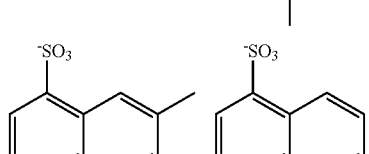
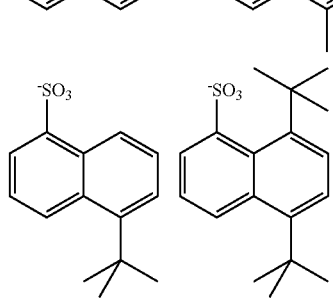

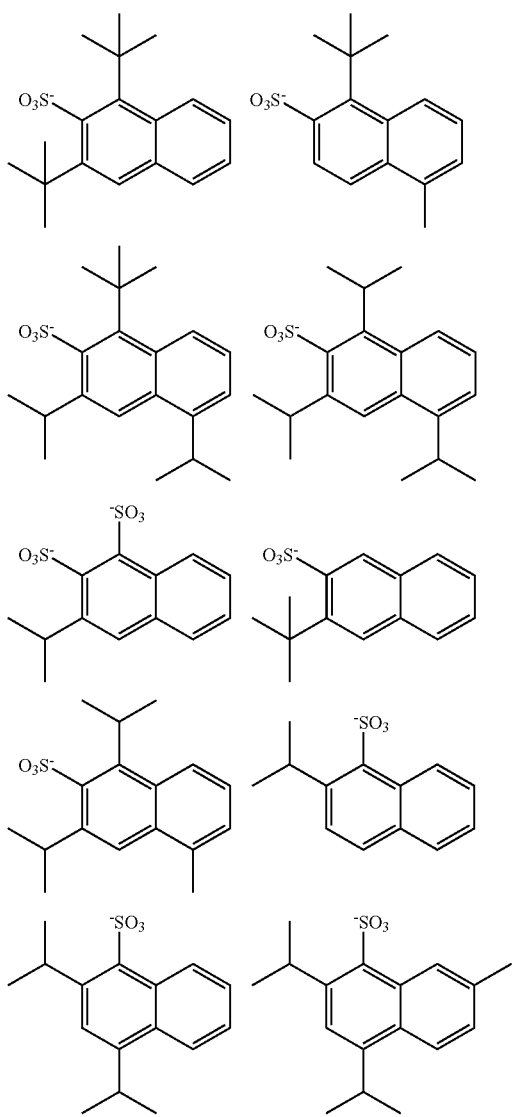
Specific examples of anion of the formula (IXb) include the followings:
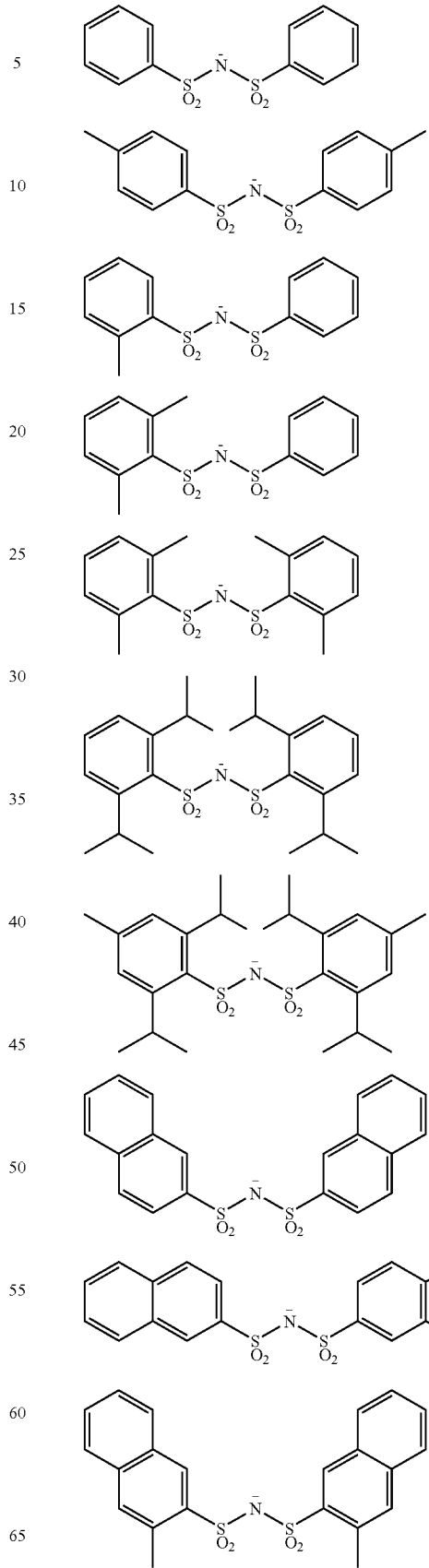

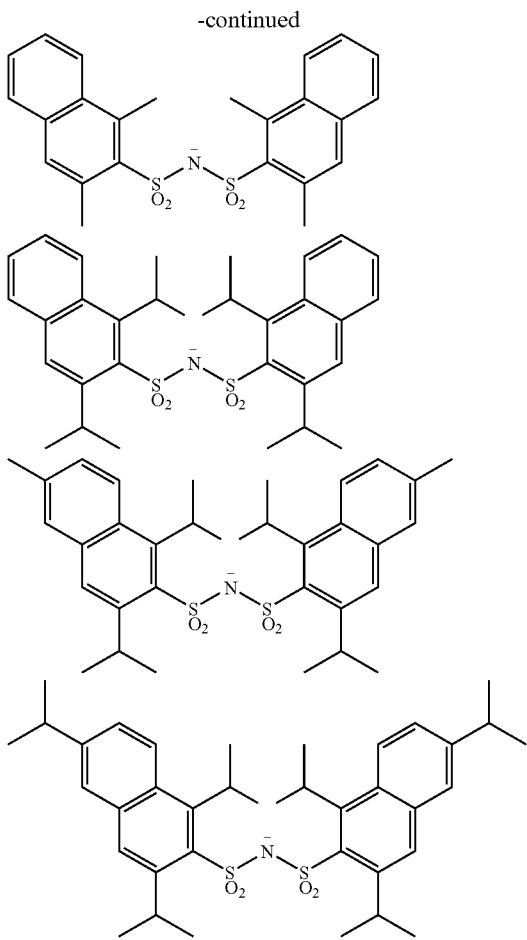

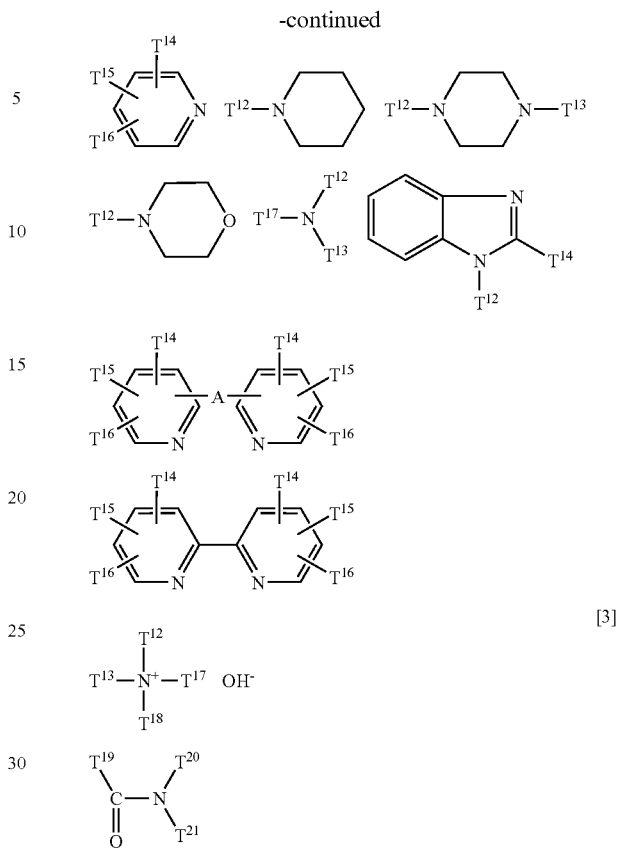

Specific examples of counter anions other than the anions of the formulas (VIII), (IXa) and IXb) include trifluoromethanesulfonate, perfluorobutanesulfonate, perfluorooctanesulfonate, hexafluoroantimonate, tetrafluoroborate, hexafluorophosphate, and the like.

The acid generator in the present resist composition can be used commercially available products, or can be produced by conventionally known method. For example, when $Z^-$ is an anion of the formula (VIII), the sulfonium salt of the formula (VIIa), the iodonium salt of the formula (VIIb) and the sulfonium salt of the formula (VIIc) can be produced according to conventional methods.

In the present composition, performance deterioration caused by inactivation of acid which occurs due to post exposure delay can be diminished by adding basic compounds, particularly, basic nitrogen-containing organic compounds, for example, amines as a quencher.

Specific examples of such basic nitrogen-containing organic compounds include the ones represented by the following formulas:

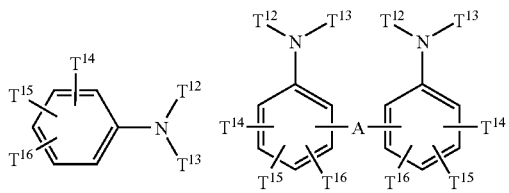

In the formulas, $T^{12}$ and $T^{13}$ each independently represents a hydrogen, an alkyl, a cycloalkyl or an aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with hydroxyl group, amino group, or alkoxy group having 1 to 6 carbon atoms. At least one hydrogen on the amino group each independently may be substituted with alkyl group having 1 to 4 carbon atoms.

$T^{14}$, $T^{15}$ and $T^{16}$ each independently represents a hydrogen, an alkyl, a cycloalkyl, an aryl or an alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with hydroxyl group, amino group, or alkoxy group having 1 to 6 carbon atoms. At least one hydrogen on the amino group may be substituted with alkyl group having 1 to 4 carbon atoms.

$T^{17}$ represents an alkyl or a cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with hydroxyl group, amino group, or alkoxy group having 1 to 6 carbon atoms. At least one hydrogen on the amino group may be substituted with alkyl group having 1 to 4 carbon atoms.

In the formulas, $T^{18}$ represents an alkyl, a cycloalkyl or an aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with a hydroxyl group, an amino group, or an alkoxy group having 1 to 6 carbon atoms. At least one hydrogen on the amino group each independently may be substituted with alkyl group having 1 to 4 carbon atoms.

However, none of $T^{12}$ and $T^{13}$ in the compound represented by the above formula [3] is a hydrogen.

A represents an alkylene, a carbonyl, an imino, a sulfide or a disulfide. The alkylene preferably has about 2 to 6 carbon atoms.

Moreover, among $T^{12}$–$T^{18}$, in regard to those which can be straight-chained or branched, either of these may be permitted.

$T^{19}$, $T^{20}$ and $T^{21}$ each independently represents a hydrogen, an alkyl having 1 to 6 carbon atoms, an aminoalkyl having 1 to 6 carbon atoms, a hydroxyalkyl having 1 to 6 carbon atoms or a substituted or unsubstituted aryl having 6 to 20 carbon atoms, or $T^{19}$ and $T^{20}$ bond to form an alkylene which forms a lactam ring together with adjacent —CO—N—.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenyl amine, triethyl amine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl] amine, triisopropanolamine, N,N-dimethylaniline, 2,6-isopropylaniline, imidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl) ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), N-methylpyrrolidone, dimethylimidazole, and the like.

Furthermore, hindered amine compounds having piperidine skeleton as disclosed in JP-A-H11-52575 can be used as quencher.

It is preferable that the present composition contains Resin (A) in an amount of about 80 to 99.9% by weight and the acid generator in an amount of 0.1 to 20% by weight based on the total amount of Resin (A) and the acid generator.

When basic compound is used as a quencher, the basic compound is contained preferably in an amount of about 0.001 to 1 part by weight, more preferably in an amount of about 0.01 to 1 part by weight based on 100 parts by weight of Resin (A).

The present composition can contain, if necessary, various additives in small amount such as a sensitizer, solution suppressing agent, other resins, surfactant, stabilizer, dye and the like, as long as the effect of the present invention is not prevented.

The present composition is usually in the form of a resist liquid composition in which the aforementioned ingredients are dissolved in a solvent, and the resist liquid composition is to be applied onto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvents.

Examples thereof include glycol ether esters such as ethyl Cellosolve acetate, methyl Cellosolve acetate and propylene glycol monomethyl ether acetate; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be described more specifically by way of examples, which are not construed to limit the scope of the present invention. The "%" and "part(s)" used to represent the content of any component and the amount of any material used in the following examples are on a weight basis unless otherwise specifically noted. The weight-average molecular weight of any material used in the following examples is a value found by gel permeation chromatography using styrene as a standard reference material.

Monomers used in Synthesis Examples are shown as follows:

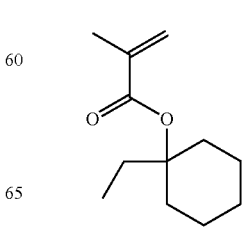

A

-continued

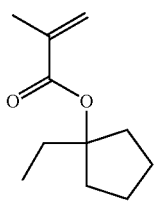
B

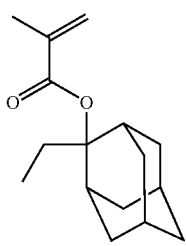
C

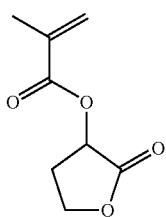
D

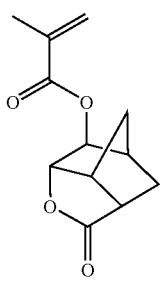
E

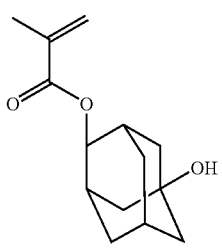
F

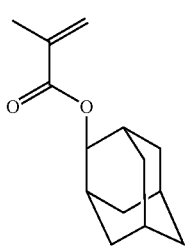
G

-continued

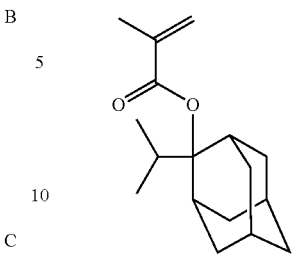
H

SYNTHESIS EXAMPLE 1

Into a four-necked flask equipped with a thermometer and condenser, 25.9 parts of 1,4-dioxane was charged and bubbled with nitrogen gas for 30 min. In the nitrogen atmosphere, after the solvent was heated up to 87° C., a solution obtained by mixing 5.85 parts of monomer A, 7.40 parts of monomer C, 6.62 parts of monomer E, 10.22 parts of monomer E, 0.49 part of azobisisobutyronitrile and 33.75 parts of 1,4-dioxane was added dropwise to the heated solvent for 1 hour with maintaining the temperature at 87° C. After the addition, the mixture was maintained at 87° C. for 5 hours. The reaction mixture was poured into a mixed solution of 259 parts of methanol and 65 parts of ion-exchanged water with stirring, the mixture was stirred, then the resin deposited in the mixture was corrected by filtration. The series of operations comprising pouring, stirring and filtration was repeated two more times, and then dried under reduced pressure to obtain polymer having Mw (weight average molecular weight) of 10030 and Mw/Mn of 1.87. This is called resin R1.

SYNTHESIS EXAMPLES 2 TO 7

The reaction and after treatments were conducted in the same manner as in Synthesis Example 1 except that monomers given in Table 1 were used in the ratio shown in Table 1 to obtain respective polymers shown in Table 1. Mw, Mw/Mn thereof and the ratio of each of structural units were shown in Table 1. In Table 1, A', B', C', D', E', F' and G' mean, respectively, structural units derived from A, B, C, D, E, F and G.

TABLE 1

| Syn. Ex. No. | Resin No. | Monomers & Molar ratio of monomers Structural units & molar ratio | Mw | Mw/Mn |
|---|---|---|---|---|
| 1 | R1 | A/C/D/E = 25/25/25/25<br>A'/C'/D'/E' = 24.1/20.5/28.7/26.7 | 10030 | 1.87 |
| 2 | R2 | A/C/D/F = 25/25/25/25<br>A'/C'/D'/F' = 22.0/17.8/30.1/30.1 | 9610 | 1.74 |
| 3 | R3 | A/C/DE/F = 20/25/30/20/5<br>A'/C'/D'/E'/F' = 19.2/23.6/31.2/20.7/5.3 | 9897 | 1.88 |
| 4 | R4 | A/C/DE/F = 30/15/30/20/5<br>A'/C'/D'/E'/F' = 27.4/12.4/32.7/21.8/5.7 | 9240 | 1.54 |
| 5 | R5 | A/C/DE/F = 20/25/30/15/10<br>A'/C'/D'/E'/F' = 15.8/19.0/35.6/12.0/17.5 | 8600 | 1.44 |
| 6 | R6 | A/H/DE/F = 20/20/30/15/15<br>A'/H'/D'/E'/F' = 16.5/9.0/37.3/18.7/18.4 | 7590 | 1.64 |
| 7 | R7 | B/G = 50/50<br>B'/G' = 43.0/57.0 | 7860 | 1.77 |
| 8 | R8 | A/G = 50/50<br>A'/G' = 42.3/57.7 | 9920 | 1.95 |

EXAMPLES 1 TO 6 AND COMPARATIVE EXAMPLES 1 TO 2

The following components were mixed and dissolved, further, filtrated through a fluorine resin filter having pore diameter of 0.2 μm, to prepare resist liquid.

<Resin>

10 parts of Resin described in Table 1.

Acid Generator

S1: 0.15 part of (4-methylphenyl)diphenylsulfonium perfluorobutanesulfonate

<Quencher>

Q1: 0.0075 part of 2,6-diisopropylaniline

<Solvent>

Kind and amount are described in Table 1.

Y1: 84 parts of methyl isobutyl ketone and 4 parts of γ-butyrolactone

Y2: 51.5 parts of propylene glycol monomethyl ether acetate, 35.0 parts of heptanone and 3.5 parts of γ-butyrolactone Silicon wafers were each coated with "ARC-29A-8", which is an organic anti-reflective coating composition available from Brewer Co., and then baked under the conditions: 215° C., 60 seconds, to form a 780 Å-thick organic anti-reflective coating. Each of the resist liquids prepared as above was spin-coated over the anti-reflective coating so that the thickness of the resulting film became 0.25 μm after drying. The silicon wafers thus coated with the respective resist liquids were each prebaked on a direct hotplate at temperature shown in "PB" column in Table 2 for 60 seconds. Using an ArF excimer stepper ("NSR ArF" manufactured by Nikon Corporation, NA=0.55 ⅔ Annular), each wafer thus formed with the respective resist film was subjected to line and space pattern exposure, with the exposure quantity being varied stepwise.

After the exposure, each wafer was subjected to post-exposure baking on a hotplate at temperature shown in "PEB" column in Table 2 for 60 seconds and then to puddle development for 60 seconds with an aqueous solution of 2.38 wt % tetramethylammonium hydroxide.

A dark field pattern developed on the organic anti-reflective coating substrate was observed with a scanning electron microscope, the results of which are shown in Table 3. The term "dark field pattern", as used herein, means a pattern obtained by exposure and development through a reticle comprising chromium base surface (light-shielding portion) and linear glass layers (light-transmitting portion) formed in the chromium surface and aligned with each other. Thus, the dark field pattern is such that, after exposure and development, resist layer surrounding the line and space pattern remains on substrate.

Effective Sensitivity:

It is expressed as the amount of exposure that the line pattern (light-shielding layer) and the space pattern (light-transmitting layer) become 1:1 after exposure through 0.13 μm line and space pattern mask and development.

Resolution:

It is expressed as the minimum size of space pattern which gave the space pattern split by the line pattern at the exposure amount of the effective sensitivity.

Pattern Shape:

When shape of patterns is good, its evaluation is marked by "⊚".

When shape of patterns has T-Top but is resolved, its evaluation is marked by "○".

When shape of patterns is not formed, its evaluation is marked by "X".

Line Edge Roughness

When line edge roughness is very good, its evaluation is marked by "⊚".

When line edge roughness is good, its evaluation is marked by "○".

When line edge roughness is bad, its evaluation is marked by "X".

TABLE 2

| Example No. | Resin | Solvent | PB | PEB |
| --- | --- | --- | --- | --- |
| Ex. 1 | R1 | Y1 | 110° C. | 100° C. |
| Ex. 2 | R2 | Y1 | 120° C. | 120° C. |
| Ex. 3 | R3 | Y2 | 120° C. | 110° C. |
| Ex. 4 | R4 | Y2 | 120° C. | 110° C. |
| Ex. 5 | R5 | Y2 | 120° C. | 110° C. |
| Ex. 6 | R6 | Y2 | 120° C. | 110° C. |
| Comp. Ex. 1 | R7 | Y1 | 120° C. | 120° C. |
| Comp. Ex. 2 | R8 | Y1 | 120° C. | 120° C. |

TABLE 3

| Example No. | Effective Sensitivity (mJ/cm$^2$) | Resolution (μm) | Pattern Shape | Line Edge Roughness |
| --- | --- | --- | --- | --- |
| Ex. 1 | 60 | 0.125 | ○ | ⊚ |
| Ex. 2 | 47.5 | 0.12 | ⊚ | ○ |
| Ex. 3 | 62.5 | 0.13 | ⊚ | ⊚ |
| Ex. 4 | 45 | 0.125 | ○ | ⊚ |
| Ex. 5 | 62.5 | 0.13 | ○ | ⊚ |
| Ex. 6 | 62.5 | 0.13 | ○ | ⊚ |
| Comp. Ex. 1 | * | * | X | * |
| Comp. Ex. 2 | * | * | X | * |

* As patterns were not formed, the evaluation can't be done.

The chemical amplification type positive resist composition of the present invention is suitable for excimer laser lithography using ArF, KrF and the like, and shows various outstanding resist abilities, specifically, gives better effective sensitivity and resolution to resist patterns obtained therefrom, and gives particularly excellent pattern shape and excellent line edge roughness.

What is claimed is:

1. A chemical amplification type positive resist composition comprising
    (A) a resin which comprises
    (i) 5 to 50% by mol, based on total structural units in the resin, of a structural unit of the formula (I)

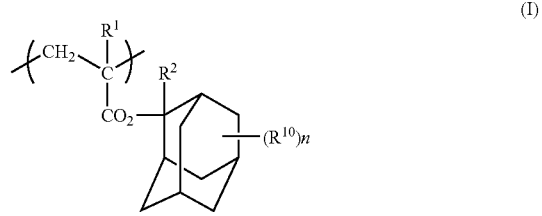

(I)

wherein $R^1$ represents a hydrogen or a methyl, $R^2$ represents $R^{10}$ represents a halogen, a hydroxyl, an alkyl or an alkoxy, n represents an integer of 0 to 3, and when n is 2 or 3, each of $R^{10}$ the same or different, (ii) 5 to 50% by mol, based on total of structural units in the resin, of a structural unit of the formula (II)

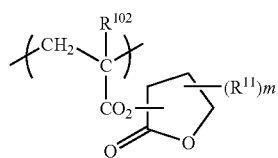
(II)

wherein $R^{102}$ represents a hydrogen or a methyl, $R^{11}$ represents an alkyl or an alkoxy, m represents an integer of 0 to 3, and when m is 2 or 3, each of $R^{11}$ is the same or different, and (iii) 5 to 50% by mol, based on total of structural units in the resin, of at least one selected from the group consisting of structural units of the formulas (III) and (IV)

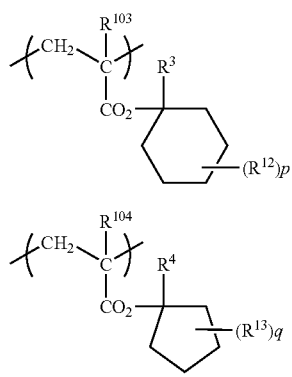
(III)

(IV)

wherein $R^{103}$ and $R^{104}$ each independently represents a hydrogen or a methyl, $R^3$ and $R^4$ each independently represents an alkyl, $R^{12}$ and $R^{13}$ each independently represents an alkyl or an alkoxy, p and q each independently represents an integer of 0 to 3, when p is 2 or 3, each of $R^{12}$ is the same or different, and when q is 2 or 3, each of $R^{13}$ is the same or different, and (B) an acid generator.

2. The composition according to claim 1, wherein the structural unit of the formula (I) is a structural unit of the formula (Ia)

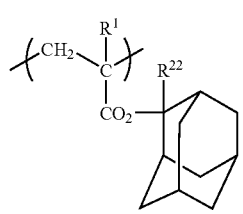
(Ia)

wherein $R^{22}$ represents a methyl, a ethyl or an isopropyl and $R^1$ has the same meaning as defined in claim 1, the structural unit of the formula (II) is a structural unit of the formula (IIa)

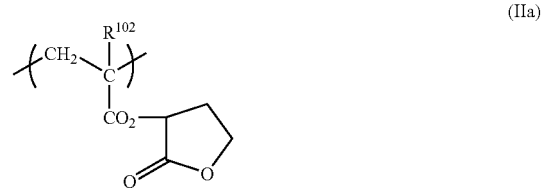
(IIa)

wherein $R^{102}$ has the same meaning as defined in claim 1, and at least one structural unit of the formulas (III) and (IV) is at least one selected from the group consisting of structural units of the formulas (IIIa) and (IVa)

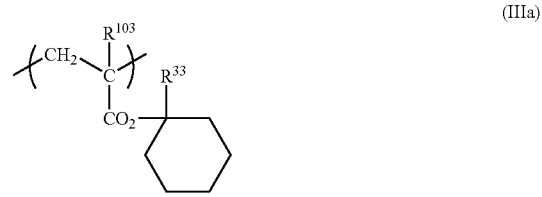
(IIIa)

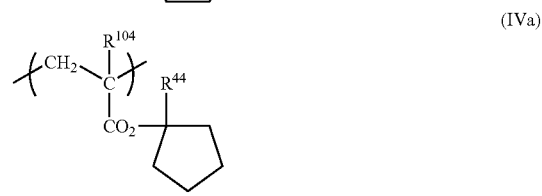
(IVa)

wherein $R^{33}$ and $R^{44}$ each independently represents a methyl, an ethyl or an isopropyl, and $R^{103}$ and $R^{104}$ have the same meanings as defined in claim 1.

3. The composition according to claim 1 further comprising 50% by mol or less of at least one selected from the group consisting of structural units of formula (V)

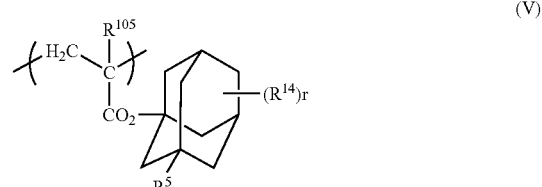
(V)

wherein $R^{105}$ represents a hydrogen or a methyl, $R^5$ represents a hydroxyl or a hydroxymethyl, $R^{14}$ represents an alkyl or an alkoxy, r represents an integer of 0 to 3, when r is 2 or 3, each of $R^{14}$ is the same or different.

4. The composition according to claim 3 wherein the at least one selected from the group consisting of structural units of the formula (V) is selected from formula (Va)

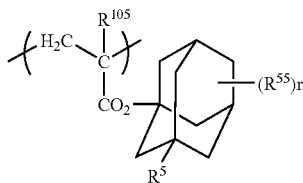

(Va)

wherein $R^{55}$ represents a hydroxyl, a methyl, an ethyl or a methoxy, r represents an integer of 0 to 3, when r is 2 or 3, each of $R^{55}$ is the same or different, and $R^{105}$ and $R^5$ each independently has the same meaning as defined in claim 3.

5. The composition according to claim 1 wherein the acid generator is at least one compound selected from the group consisting of an onium salt, an organic halogen compound, a sulfone compound and a sulfonate compound.

6. The composition according to claim 1 wherein the acid generator is onium salt.

7. The composition according to claim 1 wherein the acid generator is selected from the group consisting of a sulfonium salt of the formula (VIIa)

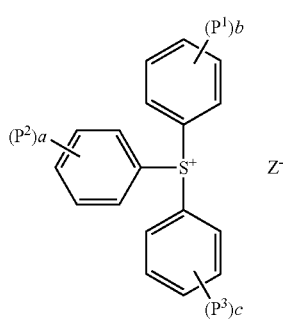

(VIIa)

wherein $P^1$ to $P^3$ each independently represents a hydroxyl, an alkyl having 1 to 6 carbon atoms or an alkoxy having 1 to 6 carbon atoms, a, b and c each independently represents an integer of 0 to 3, when a is 2 or more, each of $P^1$ is the same or different, when b is 2 or more, each of $P^2$ is the same or different, when c is 2 or more, each of $P^3$ is the same or different, and $Z^-$ represents an organic counter anion, an iodonium salt of the formula (VIIb)

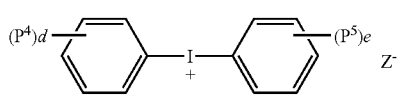

(VIIb)

wherein $P^4$ and $P^5$ each independently represents a hydroxyl, an alkyl having 1 to 6 carbon atoms or an alkoxy having 1 to 6 carbon atoms, d and e each independently represents 0 or 1, and $Z^-$ has the same meaning as defined above, and a sulfonium salt of the formula (VIIc)

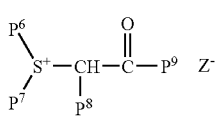

(VIIc)

wherein $P^6$ and $P^7$ each independently represents an alkyl having 1 to 6 carbon atoms or a cycloalkyl having 3 to 10 carbon atoms, or $P^6$ and $P^7$ bond to form divalent acyclic hydrocarbon having 3 to 7 carbon atoms which forms a ring together with the adjacent $S^+$, and at least one —$CH_2$— in the divalent acyclic hydrocarbon may be substituted by —CO—, —O— or —S—, $P^8$ represents a hydrogen, $P^9$ represents an alkyl having 1 to 6 carbon atoms, a cycloalkyl having 3 to 10 carbon atoms or aromatic ring group optionally substituted, or $P^8$ and $P^9$ bond to form 2-oxocycloalkyl together with the adjacent —CHCO—, and $Z^-$ has the same meaning as defined above.

8. The composition according to claim 7 wherein $Z^-$ is an anion of the formula (VIII)

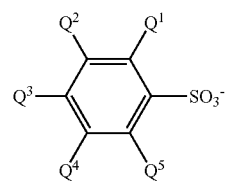

(VIII)

wherein $Q^1$, $Q^2$, $Q^3$, $Q^4$ and $Q^5$ each independently represents a hydrogen, an alkyl having 1 to 16 carbon atoms, an alkoxy having 1 to 16 carbon atoms, a halogen, a haloalkyl having 1 to 8 carbon atoms, an aryl having 6 to 12 carbon atoms, an aralkyl having 7 to 12 carbon atoms, a cyano, an alkylthio having 1 to 4 carbon atoms, an alkylsulfonyl having 1 to 4 carbon atoms, a hydroxyl, a nitro or a group of the formula (VIII')

—COO—X—$Cy^1$ (VIII')

wherein X represents an alkylene and at least one —$CH_2$— in the alkylene may be substituted by —O— or —S—, $Cy^1$ represents an alicyclic hydrocarbon having 3 to 20 carbon atoms.

9. The composition according to claim 8 wherein $Z^-$ is an anion of the formula (IXa)

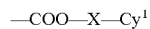

(IXa)

wherein $Q^6$ represents a perfluoroalkyl having 1 to 20 carbon atoms, an optionally substituted naphtyl having 10 to 20 carbon atoms or an optionally substituted anthryl having 10 to 20 carbon atoms, or an anion of the formula (IXb)

(IXb)

wherein $Q^7$ and $Q^8$ each represents a perfluoroalkyl having 1 to 20 carbon atoms or an optionally substituted aromatic group having 6 to 20 carbon atoms.

10. The composition according to claim 1 wherein the content of the resin is 80 to 99.9% by weight and the content of the acid generator is 0.1 to 20% by weight based on the total amount of the resin and the acid generator.

11. The composition according to claim 1 wherein the composition further comprises basic nitrogen-containing organic compound as a quencher.

12. The composition according to claim 11 wherein the content of the basic nitrogen-containing organic compound is 0.001 to 1 part by weight per 100 parts by weight of the resin.

* * * * *